(12) United States Patent
Fiolka et al.

(10) Patent No.: US 8,587,767 B2
(45) Date of Patent: Nov. 19, 2013

(54) ILLUMINATION OPTICS FOR EUV MICROLITHOGRAPHY AND RELATED SYSTEM AND APPARATUS

(75) Inventors: Damian Fiolka, Oberkochen (DE); Berndt Warm, Schwaig (DE); Christian Steigerwald, Heidenheim (DE); Martin Endres, Koenigsbronn (DE); Ralf Stuetzle, Aalen (DE); Jens Ossmann, Aalen (DE); Ralf Scharnweber, Aalen (DE); Markus Hauf, Ulm (DE); Udo Dinger, Oberkochen (DE); Severin Waldis, Aalen (DE); Marc Kirch, Aalen (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 302 days.

(21) Appl. No.: 12/915,785

(22) Filed: Oct. 29, 2010

(65) Prior Publication Data
US 2011/0063598 A1    Mar. 17, 2011

Related U.S. Application Data

(63) Continuation of application No. PCT/EP2009/002584, filed on Apr. 8, 2009.

(60) Provisional application No. 61/049,188, filed on Apr. 30, 2008.

(30) Foreign Application Priority Data

Apr. 30, 2008    (DE) .................... 10 2008 001 511

(51) Int. Cl.
*G03B 27/72*    (2006.01)
*G03B 27/54*    (2006.01)
*G03B 27/68*    (2006.01)
*G03B 27/42*    (2006.01)
*G03B 27/32*    (2006.01)

(52) U.S. Cl.
USPC ................... 355/71; 355/52; 355/53; 355/67; 355/77

(58) Field of Classification Search
USPC ........... 355/52, 53, 55, 67–71, 77; 250/492.1, 250/492.2, 492.22, 548; 430/5, 8, 22, 30, 430/311, 312
See application file for complete search history.

(56) References Cited

U.S. PATENT DOCUMENTS 5,486,896 A * 1/1996 Hazama et al. ................. 355/71
6,051,842 A * 4/2000 Yamamoto .................... 250/548

(Continued)

FOREIGN PATENT DOCUMENTS

DE       199 03 807       11/1999
DE       10 2006 036 064   2/2008

(Continued)

OTHER PUBLICATIONS

International Search Report and a Written Opinion from the counterpart PCT Application No. PCT/EP2009/002584, dated Jul. 17, 2009.

(Continued)

*Primary Examiner* — Toan Ton
*Assistant Examiner* — Christina Riddle
(74) *Attorney, Agent, or Firm* — Fish & Richardson P.C.

(57) ABSTRACT

Illumination optics for EUV microlithography guide an illumination light bundle from a radiation source to an object field with an extension ratio between a longer field dimension and a shorter field dimension, where the ratio is considerably greater than 1.

22 Claims, 24 Drawing Sheets

(56) References Cited

U.S. PATENT DOCUMENTS

| | | | |
|---|---|---|---|
| 6,198,793 B1* | 3/2001 | Schultz et al. | 378/34 |
| 6,658,084 B2 | 12/2003 | Singer | |
| 6,859,328 B2 | 2/2005 | Schultz et al. | |
| 7,345,741 B2* | 3/2008 | Shiozawa et al. | 355/71 |
| 7,636,149 B2 | 12/2009 | Suzuki | |
| 2001/0046039 A1 | 11/2001 | Kudo | |
| 2003/0227603 A1* | 12/2003 | Dierichs | 355/47 |
| 2004/0170928 A1* | 9/2004 | Herr et al. | 430/311 |
| 2004/0263816 A1* | 12/2004 | Van Dam | 355/67 |
| 2005/0140957 A1* | 6/2005 | Luijkx et al. | 355/71 |
| 2005/0270513 A1* | 12/2005 | Dierichs et al. | 355/67 |
| 2006/0170895 A1 | 8/2006 | Fiolka | |
| 2006/0244941 A1 | 11/2006 | Gruner et al. | |
| 2007/0041004 A1* | 2/2007 | Suzuki | 355/67 |
| 2007/0058274 A1* | 3/2007 | Singer et al. | 359/857 |
| 2007/0263198 A1* | 11/2007 | Kamm et al. | 355/67 |
| 2008/0113281 A1* | 5/2008 | Maul et al. | 430/7 |
| 2008/0220345 A1* | 9/2008 | Van De Kerkhof et al. | 430/30 |
| 2008/0278704 A1* | 11/2008 | Endres et al. | 355/67 |
| 2009/0251677 A1 | 10/2009 | Endres et al. | |

FOREIGN PATENT DOCUMENTS

| | | | |
|---|---|---|---|
| DE | 10 2006 059 024 | 6/2008 | |
| DE | 10 2007 061 194 | 6/2008 | |
| EP | 1 349 009 | 10/2003 | |
| EP | 1884831 A2 * | 2/2008 | G03F 7/20 |
| JP | 2002-033272 | 1/2002 | |
| JP | 2006-278348 | 10/2006 | |
| JP | 2007-500432 | 1/2007 | |
| JP | 2007-155927 | 6/2007 | |
| WO | WO 2004/100236 | 11/2004 | |
| WO | WO 2005/015314 | 2/2005 | |
| WO | WO 2005/040927 | 5/2005 | |
| WO | WO 2006/136353 | 12/2006 | |
| WO | WO 2007/039257 | 4/2007 | |
| WO | WO 2007/138805 | 12/2007 | |

OTHER PUBLICATIONS

English translation of German Examination Report for corresponding German Patent Application 10 2008 001 511.3-51, dated Dec. 1, 2008.

Japanese Office Action, and English translation thereof, for JP Patent Application No. 2011-506588, dated Feb. 14, 2013.

* cited by examiner

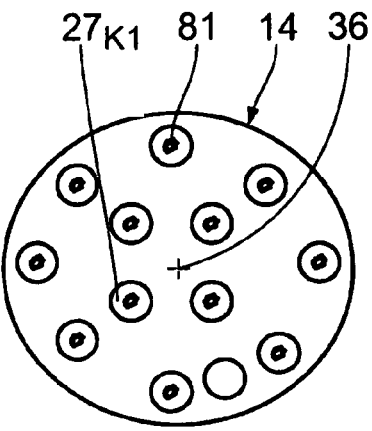 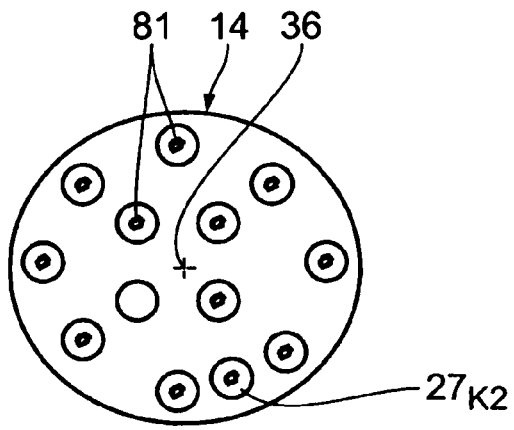
Fig. 27    Fig. 28
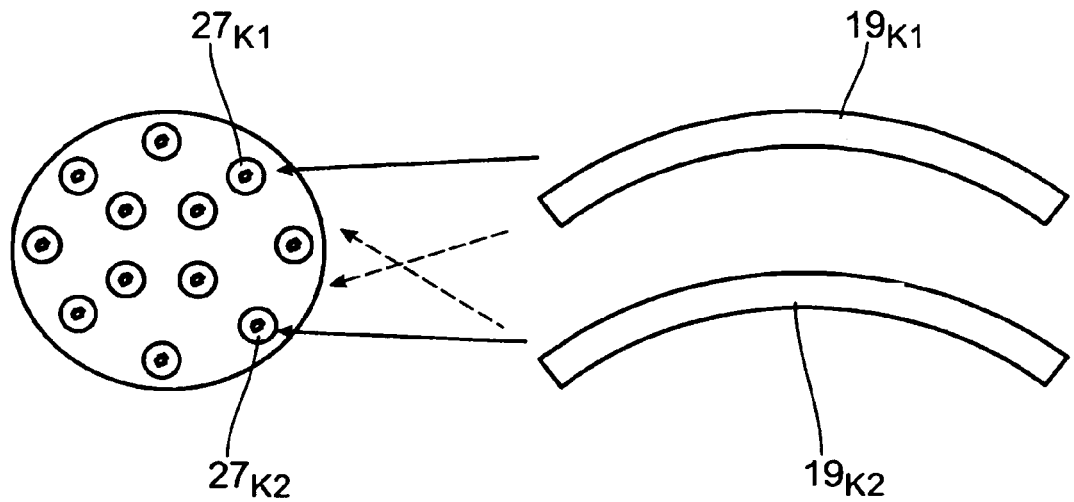
Fig. 29

ILLUMINATION OPTICS FOR EUV MICROLITHOGRAPHY AND RELATED SYSTEM AND APPARATUS

CROSS-REFERENCE TO RELATED APPLICATIONS

This application is a continuation of, and claims benefit under 35 USC 120 to, international application PCT/EP2009/002584, filed Apr. 8, 2009, which claims benefit of German Application No. 10 2008 001 511.3, filed Aug. 30, 2008 and U.S. Ser. No. 61/049,188, filed Apr. 30, 2008. International application PCT/EP2009/002584 is hereby incorporated by reference in its entirety.

FIELD

The disclosure relates to an illumination optics for EUV microlithography that includes a field facet mirror and a following optics that includes a pupil facet mirror. The disclosure further relates to an illumination system that includes an illumination optics of this type, and a projection exposure apparatus that includes. In addition, the disclosure relates to a method of producing a micro- or nanostructured component and to a component produced via this method.

BACKGROUND

A projection exposure apparatus is disclosed in U.S. Pat. No. 6,658,084 B2. Other projection exposure apparatuses are disclosed in U.S. Pat. No. 6,859,328 B2, in US 2007/0041004 A1, in US 2006/0170895 A1, and in EP 1 349 009 A2.

SUMMARY

The disclosure provides an illumination optics designed so that unwanted variations of illumination parameters, for instance of an illumination intensity distribution or of an illumination angle distribution, can be corrected across the object field.

In some embodiments, the disclosure provides an illumination optics for EUV microlithography for guiding an illumination light bundle from a radiation source to an object field with an aspect ratio between a longer field dimension and a shorter field dimension, the aspect ratio being greater than 1, via a field facet mirror including a plurality of field facets for setting defined illumination conditions in the object field, via a following optics arranged downstream of the field facet mirror for transmitting the illumination light to the object field, the following optics including a pupil facet mirror with a plurality of pupil facets. The field facets are individually allocated to the pupil facets so that portions of the illumination light bundle impinging upon a respective one of the field facets are guided on to the object field by the associated pupil facet. The field facet mirror not only includes a plurality of basic illumination field facets which provide a basic illumination of the object field via associated basic illumination pupil facets, but also includes a plurality of correction illumination field facets which allow for a correction of the illumination of the object field via associated correction illumination pupil facets. The field facet mirror is switchable between at least two modes of operation which are different in terms of the number and/or the arrangement of the correction illumination field facets contributing to the illumination of the object field. The correction illumination field facets have a given illumination light reflectivity which results in an illumination along the longer field dimension of the object field with an illumination intensity which has a predetermined pattern along the longer field dimension that deviates from a constant intensity exposure in a defined manner.

It has been found according to the disclosure that EUV light, which had so far not been used at all or not in an efficient manner, can be used for correcting the object field illumination without losing virtually any EUV illumination light used in the actual projection exposure. This in particular allows an illumination intensity distribution or an illumination uniformity to be defined across the object field.

The correction illumination facets may be exposed to portions of the EUV light which had so far not been used because of for instance a low intensity or intensity variations which exceed predetermined tolerance limits. The intensity of the EUV illumination light exposure of these correction illumination field facets, and therefore the intensity of the corrective effect, can be defined by selecting the location for the correction illumination field facets to be arranged. The corrective influence of the illumination angle distribution can be defined by the arrangement of the correction illumination pupil facets which are allocated to the correction illumination field facets. The illumination correction in the object field may be limited to a correction of the intensity distribution of the illumination light across the object field. It is furthermore possible to correct an illumination angle distribution across the object field. Combinations of an intensity distribution correction and an angle distribution correction across the object field are conceivable as well. The aspect ratio between the larger and the shorter field dimension may for instance be 2:1, 3:1, 4:1 or even greater, for instance 7:1, 8:1, 10:1, 13:1 or even greater. The correction illumination field facets may have a different design than the basic illumination field facets and may differ from the basic illumination field facets for instance in terms of their size or their reflectivity, in particular in terms of their reflectivity distribution. The bundle guiding effect of the correction illumination field facets is dynamically controllable by actuation of the correction illumination field facets via actuators, thus ensuring a dynamic correction of the intensity distribution of the illumination light across the object field by varying a region within the object field which is exposed to illumination from the correction illumination field facet. Due to the fact that the bundle guiding effect of the correction illumination field facets is dynamically controllable via a control device of the illumination optics, a high flexibility of the corrective effect of the correction illumination field facets is obtained. The bundle guiding effect is dynamically controllable either by a displacement of the correction illumination field facets or for instance by a dynamically variable shading of the correction illumination field facets. The correction illumination is achievable by a shading of the correction illumination facet, for instance by a partial shading using at least one stop or a stop structure.

The current mode of operation can for instance be changed by switching on and off active correction illumination field facets. Thus, in a first mode of operation, all correction illumination field facets may be active for bundle guidance while in another mode of operation, only selected correction illumination field facets may be active, and in another mode of operation, none of the correction illumination field facets may be active. This also ensures a high flexibility of the corrective effect of the correction illumination field facets.

A reflectivity of the correction illumination field facets for the illumination light, which results in an illumination along the longer field dimension of the object field with an illumination intensity having a predetermined distribution that deviates from a constant intensity exposure in a defined manner, is achievable in various ways. If the correction illumination field facets have a constant reflectivity across the longer field facet dimension, which is generally similar to the longer field dimension, the intensity exposure that varies across the field dimension is achievable by defined switching of a portion of the correction illumination field facet along the longer field facet dimension, i.e. for instance by shading a partial correction illumination facet so that the light thereof does not reach the object field at all or only to some extent. Alternatively, the correction illumination field facet may have a reflectivity pattern which deviates from a constant reflectivity in a defined manner. Such a reflectivity pattern which deviates from a constant reflectivity in a predetermined, defined manner along the longer field facet dimension that is generally similar to the direction of the longer field dimension may for instance be such that it is linearly dependent on a field height, in other words linearly dependent on a field dimension which is perpendicular to a scanning direction of a projection exposure apparatus that is equipped with the illumination optics. Other field height dependencies of the reflectivity pattern, for instance in the form of a quadratic or higher-power function, a sinusoidal or cosinusoidal function or a step function, are conceivable as well. As a general rule, it is possible to define sets of correction illumination field facets with intensity variations across the field height which correspond to a set of orthogonal functions. This allows virtually any desired reflectivity pattern to be defined as a correction value. A set of correction illumination field facets with a predetermined distribution of functions such as a polynomial analysis may be used to perform a Fourier synthesis of a predetermined intensity variation across the field. A step function of the reflectivity pattern is for instance achievable by dividing the correction illumination field facet into a plurality of regions with various reflectivities along the longer field facet dimension. The following optics may be used to image the field facet into the object field.

A plurality of stops may be provided which are arrangeable in front of the pupil facet mirror, with each of the stops shading illumination light portions of different arrangements of allocated correction illumination field facets. The stops may in particular be designed in such a way that each of the stops is translucent to all portions of the illumination light bundle which are allocated to the basic illumination field facets, and furthermore to portions of the illumination light bundle which are in each case allocated to another grouping of correction illumination field facets.

Stops of this type may in particular be provided in a stop-changing holder. One of these stops may also block the portions of the illumination light bundle which are allocated to all correction illumination field facets so that only the portions of the illumination light bundle which are allocated to the basic illumination field facets are allowed to pass through. The plurality of stops may take account of various illumination situations. It may for instance be the case that various illumination settings (conventional, annular, dipole, quadrupole, multipole) involve different corrections which are achieved using respectively associated stops.

The illumination optics may be configured in such a way that at least one of the correction illumination field facets does not illuminate the entire object field but only a partial area thereof. If an intensity correction of this type is desired at particular field points of the object field, this allows the intensity at these field points to be increased in a defined manner. Moreover, a fine adjustment of the corrective effect of such a correction illumination field facet illuminating only a partial area of the object field is possible by finely adjusting the illumination generated in the object field by this correction illumination field facet.

Portions of the correction illumination field facets may not be provided with a highly-reflective coating. When the correction illumination field facets are designed in such a way, the reflectivity is reduced as desired in those portions where no highly-reflective coating is applied. Correction illumination field facets of this type are for instance produced by shading the desired portions when the reflective coating is applied.

An EUV gray filter with variable reflectivity is an alternative embodiment of the correction illumination field facets with a reflectivity that varies across the field height. Instead of an EUV gray filter, there may also be provided a stop or stop structure which is arranged in front of the respective correction illumination field facet. This stop structure may be composed of a plurality of individual stops which are arranged next to one another and which may in particular be in the shape of a finger. If the correction illumination field facet has a reflective surface with an aspect ratio that is considerably different from one, the stop or the stop structure may be secured to a longitudinal side of a facet base body of the correction illumination field facet via for instance magnetic a fastening mechanism. To this end, a permanent magnet in particular in the shape of a magnetic strip may be disposed on the facet base body, in particular on the side wall thereof which terminates the longitudinal side of the reflective surface. A stop or stop structure of this type may also be secured to a facet base body of a facet which is adjacent to one of the correction illumination field facets. Holding structures for individual facets, which may be combined to form a stop structure of a correction illumination field facet or of a correction illumination pupil facet, may also be arranged in a reflective surface of the facet. Holding structures of this type may be configured as magnetic strips or as magnetic surfaces or surfaces portions which are small compared to the reflective surface and which may in particular be permanently magnetic. As an alternative or in addition to magnetic forces, van der Waals forces or adhesive forces may serve for fastening or holding the individual stops or the entire stop structures.

The separate stops or the stop structures may be attached via an attachment device corresponding to a design of the individual stops or the stop structure which had been determined before via a calibration measurement or a calculation. If the individual stops or the stop structures are held in place on the correction illumination field facet or the correction illumination pupil facet by magnetic forces, the attachment device may be configured as a device which holds the stops or stop structures by electromagnetic forces when the latter are moved to the location of attachment. An attachment device of this type may also be used to remove the stops or stop structures from the location of attachment. The stops or stop structures may also be removed or stripped off via a stripping device which removes the stops or stop structures by suction, rolling or via electrostatic forces, for instance by charging the material of the stops or stop structures and stripping them off via an oppositely charged stripping device.

The gray filter having the absorbing point structures may be formed by absorbing point structures covering the reflective surface of the correction illumination field facet, the absorbing point structures being distributed across the reflective surface in a predetermined manner. Point structures of this type are a variant of a gray filter which is accessible by EUV wavelengths.

A separate gray filter portion may be disposed on the correction illumination field facet. The gray filter portion may be separate from a portion which is reflective of the illumination light. In a design of this type, the functional sections "filter" and "reflector" are separate from each other on the correction illumination field facets which facilitates the individual processing thereof.

In a gray filter portion of this type, absorbing point structures may be distributed with a constant area density. This results in a variable reflectivity by variation of the width of the gray filter portion perpendicular to the long field facet dimension. A gray filter portion of this type can be produced with relatively little effort.

A maximum width of the gray filter portion may be smaller than the width of the correction illumination field facet perpendicular to the long field facet dimension. A gray filter of this type permits a fine adjustment of an intensity variation as no full variation amplitude of the filtering effect of the gray filter portion across the entire width of the correction illumination field facet perpendicular to the long field facet dimension is given.

In the gray filter portion, the point structures may be distributed with a varying area density. In a design of this type, a separation into a filter portion and a reflection portion is not compulsory. This avoids boundary effects between the filter portion and the reflection portion.

The illumination optics may have at least two similar correction illumination field facets. The correction illumination field facets may include at least one group of typified correction illumination field facets which have the same reflectivity pattern across the long field facet dimension. Such groups ensure that a similar intensity influence is exerted on different illumination angles of the object field.

The similar, in other words typified correction illumination field facets may be allocated to correction illumination pupil facets which are point-symmetric to a center of the pupil which is defined by the pupil facet mirror. For instance, a symmetric arrangement of this type allows a group of two typified correction illumination field facets to be formed for correcting a two-fold illumination setting, i.e. of dipole illumination settings. If groups of in each case four typified correction illumination field facets with the same reflectivity area are provided, this may serve for the correction of illumination parameters of the object field illumination without affecting the telecentricity and/or the ellipticity of the object field illumination. Alternatively, a defined deviation of the arrangement of the correction illumination pupil facets or of the form of the correction illumination field facets is conceivable as well, which not only allows an intensity distribution of the object field illumination but also an illumination angle distribution to be influenced in a defined manner.

Effectively illuminated areas of the correction illumination field facets may have a boundary shape which differs from a boundary shape of the basic illumination field facets. An effectively illuminated area of the correction illumination field facets is the area of the correction illumination field facet whose illumination actually contributes to the illumination channel. With this in mind, it shall be noted that shaded areas on the correction illumination field facets do not contribute to the effectively illuminated area of this facet. Alternatively, instead of influencing the boundary shape by selectively shading portions of the correction illumination field facet, a boundary shape differing from a boundary shape of the basic illumination field facets is also achievable by an outer shape of the correction illumination field facets which differs from that of the basic illumination field facets. The basic illumination field facets may for instance have a rectangular or a curved boundary shape.

The boundary shape of the effectively illuminated areas of the correction illumination field facets may have at least one inflection point. This allows even more complex intensity distributions to be obtained across the long field facet dimension and therefore across the long object field dimension.

The correction illumination field facets may have a surface area which is a partial surface area of a basic illumination field facet. In the case of such a partial field illumination, the correction illumination field facets ensuring this partial field illumination may have an effectively illuminated surface area which amounts to between 1% and a major part, for instance 90%, of the illuminated surface areas of the basic illumination field facets. The effectively illuminated surface area of the correction illumination field facets may amount to 5%, 10%, 20%, 25%, 30%, 40%, 50%, 60%, 70%, and 80% of the illuminated surface area of one of the basic illumination field facets.

The correction illumination field facet may be at least one mirror which is actively displaceable, in particular actively tiltable and/or shiftable. Mirrors of this type allow an object field portion to be selected for correction in the object field.

A boundary shape of the effectively illuminated areas of the correction illumination field facets and/or the effectively illuminated areas of the correction illumination pupil facets can be influenced via a shading body. A shading body of this type allows the corrective effect of the correction illumination field facets to be influenced in a defined manner.

A support structure which supports the shading body can be disposed in a shaded space of the field facet mirror. A support structure of this type does not lead to an unwanted shading.

A shading body, which is spaced from a reflection plane defined by the reflective surface of the facet mirror, is displaceable relative to the facet mirror so as to influence the corrective effect of the respective correction illumination field facet in a defined manner. A shading body of this type may be used with a facet which is otherwise not different from a basic illumination field facet.

A shading body which is disposed between two facets may influence two correction illumination facets at the same time.

The shading body may have a base body
which extends along a gap between two adjacent facets;
whose width is no larger than the width of the gap between the two adjacent facets; and
on which are arranged shading portions whose width is greater than the width of the gap between the two adjacent facets.

A shading body of this type ensures a defined shading effect across the entire large field dimension.

A wire is a simple base body.

A base body in the form of a film strip or a tape can be handled in a relatively simple manner.

The shading portions may be designed in such a way that they are formed by removing or cutting material from the edges of a blank base body, the base body is produced in the same way. The shading portions may be formed by thickness variations of the base body at least in a dimension perpendicular to the beam direction of the illumination light bundle. Forms or forming methods of this type proved to be particularly suitable for achieving a selective shading across the field height of the object field.

A sinusoidal thickness variation of the base body fulfills particular desired correction properties in a particularly advantageous manner. Seen in the beam direction, there may also be provided several base bodies of this type having a sinusoidal thickness variation which are arranged on top of or next to one another so as to be displaceable relative to each other. This permits a fine adjustment of an intensity distribution across the large field dimension by displacing the two base bodies with the sinusoidal thickness variation relative to each other.

Disc-shaped shading portions are variable in terms of their effective shading size depending on the orientation of a normal to the disc plane relative to the direction of the beam to be shaded.

A plurality of shading portions may be arranged along the base body in a sequence which corresponds to a predetermined intensity distribution I(x) in a field plane of the illumination optics. Such an arrangement is a defined possibility of setting an intensity variation across the field height (x).

There may be provided a plurality of shading bodies having in each case one base body and in each case a plurality of shading portions, with at least two of the shading portions differing in terms of at least one of the group of the following parameters:
  distance of the shading portions along the base body;
  position of the shading portions relative to the associated correction illumination facet;
  shading diameter of the shading portion.

Shading bodies of this type allow intensity variations to be superimposed by the influence of the correction illumination facets. Intensity variations of this type allow a desired, predetermined intensity distribution of an object field illumination to be generated in the manner of a Fourier analysis.

A shading body, which is longer along the longer field facet dimension than the correction illumination facet allocated thereto, may be influenced in a defined manner by displacement relative to the facet along the longer field facet dimension. This displacement of the shading body allows for the setting of varying illumination fields.

Both ends of the shading body may be wound on in each case one roll in an unwindable manner, with an area of the shading body used for shading being guided between the two rolls. A holding mechanism for the shading body of this type are applicable in practice.

A drive for winding and unwinding the shading body allows the shading body to be adapted to a desired intensity variation in a controlled manner.

The rolls and the drive for winding and unwinding the shading body may be arranged outside an evacuated space in which the remaining illumination optics is arranged. It is then not necessary for the drive and the rolls to be vacuum-compatible.

A forming device, in particular a cutting device, for defining a form of the shading portions allows the intensity-varying effect of the shading body to be adjusted online.

A reading device for detecting marks on the shading body for instance allows a marked or coded sequence of shading portions to be defined for a subsequent selection. Moreover, a reading device of this type permits a positional control of shading portions on the shading body.

The shading body may have an insertion portion which is inserted between two facets. An insertion portion of this type ensures a reliable positioning of the shading body relative to the correction illumination facets.

A shading body which is displaceable perpendicular to a reflective surface of the facet mirror permits a fine adjustment of the shading effect of the shading body.

The correction illumination field facets may be arranged outside an illuminated contour of the field facet mirror, the contour being defined by all of the basic illumination field facets. When the correction illumination field facets are arranged in such a way, this allows one to make use of light portions which had so far not been actively used. However, it is generally conceivable as well to use internal facets of the field facet mirror as correction illumination field facets.

The correction illumination pupil facets may be arranged in an illuminated contour of the pupil facet mirror, the contour being defined by all of the basic illumination field facets. When the correction illumination pupil facets are arranged in such a way, the illumination from illumination angles of basic illumination pupil facets transmitting an unwanted low illumination intensity may be increased by correction illumination pupil facets which are directly adjacent to these basic illumination pupil facets.

A corrective effect of the associated correction illumination pupil facet can be influenced via a shading body which is allocated to at least one of the correction illumination pupil facets in such a way as to cover it in a variable manner.

At least some of the basic illumination field facets may in each case cooperate with at least one actuator for displacing, in particular tilting and/or shifting, the basic illumination field facets. Such an actuated tilting movement may in particular result in a displacement of source images on the pupil facet mirror. This may be useful for correcting the object field illumination.

The same applies to an optional actuated displacement of the correction illumination field facets.

An actuated displaceability, in particular a displaceability and/or a shiftability, of the basic illumination pupil facets may in particular lead to a shifting of the field contributions of individual illumination channels. Likewise, the allocation of field facets to pupil facets within an illumination channel is variable as well.

The same applies to an actuated displaceability of the correction illumination pupil facets.

The correction illumination field facets may be oriented relative to the correction illumination pupil facets in such a way that the portion of the illumination light bundle, which is transmitted from the correction illumination field facets to the correction illumination pupil facets, is not entirely transmitted by the correction illumination pupil facets but is cut off at the edges in a defined manner, which may be a useful approach for correcting the object field illumination.

The same applies if the edges of the portion of the illumination light bundle, which is transmitted from the correction illumination pupil facets to the object field, are cut off at the edge of the object field.

At least one of the correction illumination field facets may be divided into a plurality of partial correction illumination facets which are orientable independently of one another. The at least two modes of operation of a correction illumination field facet mirror of this type are then achieved by actuating the partial correction illumination facets in different ways so that the contribution of the partial correction illumination facets to the object field illumination depends on the way they are actuated. Via the partial correction illumination facets, different illumination channels can be selected depending on their orientation, which allows an illumination angle distribution of the object field illumination to be influenced via the partial correction illumination facets. Switching on or off the intensity contribution of a partial correction illumination facet across the object field may have an influence on the intensity of the object field illumination.

The partial correction illumination facets may have a smaller extension along the longer field facet dimension than the basic illumination field facets. This allows one to correct the intensity to which the object field is exposed across an object field portion whose extension corresponds to that of the partial correction illumination facets.

The partial correction illumination facets may be arranged in at least one row along the longer field facet dimension. Along a row of this type, whose total extension may correspond to the extension of a basic illumination field facet along the longer field facet dimension, there may for instance be 2, 3, 4, 5, 10 or even more partial correction illumination facets. This results in a correspondingly fine adjustment of the illumination of the object field along the longer field dimension.

A division of the basic illumination field facets along the longer field facet dimension into a plurality of partial basic illumination facets has corresponding advantages.

There may be gaps between adjacent partial basic illumination facets, with the partial correction illumination facets being arranged in such a way that they cover the gaps when seen in the direction of the shorter field facet dimension. The partial correction illumination facets allow an unwanted intensity reduction of the object field illumination to be compensated, the intensity reduction being caused these gaps.

The partial correction illumination facets may be configured as micromirrors which are actuable independently from one another. Correspondingly, the partial basic illumination facets may also be configured as micromirrors which are actuable independently from one another. This results in an advantageous structural integration of the partial facets.

The partial correction illumination facets may be arranged on a partially shaded area of a carrier of the field facet mirror so that only a portion of the partial correction illumination facets can be reached by illumination light in the direction of the shorter field facet dimension. As the partial correction illumination facets are only partially illuminated, a correspondingly fine corrective intensity resolution is achievable via the partial correction illumination facets.

The extension of the partial correction illumination facets may be smaller along the shorter field facet dimension than that of the basic illumination field facets. Alternatively or in addition to the above explained partial shading of the partial correction illumination facets, this may result in an advantageously high corrective resolution of the object field illumination across the longer field dimension.

The field facet mirror may be divided into a plurality of field facet blocks; the partial correction illumination facets may then be a facet near the edge of one of the field facet blocks, which allows the field facet mirror to be produced in modules.

In a direction perpendicular to a main carrier plane, the field facet blocks can be staggered relative to each other in the manner of steps. This facilitates an integration of the field facet blocks.

The partial correction illumination facets may be arranged in several rows along the longer field dimension. This enhances the flexibility of the corrective effect. The partial correction illumination facets of one row or of several rows may be active, with the result that the contributions of the partial correction illumination facets are variably definable across the longer field dimension of the object field.

The partial correction illumination facets in the various rows may have different extensions along the shorter field facet dimension. This enhances the flexibility of the corrective effect of the partial correction illumination facets even further. If the object field illumination only involves minor corrections across the longer field dimension, a partial correction illumination facet may be used which has a small extension along the shorter field facet dimension. If greater corrections are desired, a partial correction illumination facet from another row may be used which has a larger extension along the shorter field dimension.

In practical application, an extension ratio of the partial correction illumination facets in the various rows along the shorter field dimension of no more than 1:2 allows a correction contribution to be achieved with a relative intensity 1 when using the partial correction illumination facets of the row with the smaller extension along the shorter field dimension, with a relative intensity 2 when using the partial correction illumination facets of the row with the larger extension along the shorter field dimension, and with a relative intensity 3 when using both rows of the partial correction illumination facets. Other extension ratios between the various rows of the partial correction illumination facets are conceivable as well, for instance 1:3 or 1:4. Even more than two rows of partial correction illumination facets are applicable, with the result that when selected rows are in use, extension ratios of for instance 1:2:4 or of 1:2:4:8 are achievable when using three or four of such rows of partial correction illumination facets with corresponding resolutions of the different correction contributions.

The object mentioned at the outset is furthermore achieved according to the disclosure by an illumination optics for EUV microlithography for guiding an illumination light bundle from a radiation source to an object field with an aspect ratio between a longer field dimension and a shorter field dimension, the aspect ratio being greater than 1, including
  a field facet mirror with a plurality of field facets for setting defined illumination conditions in the object field;
  a following optics downstream of the field facet mirror for transmitting the illumination light into the object field;
  wherein the following optics includes a pupil facet mirror with a plurality of pupil facets, with the field facets being in each case individually allocated to the pupil facets so that portions of the illumination light bundle impinging upon in each case one of the field facets are guided on to the object field via the associated pupil facet;
wherein the field facet mirror not only includes a plurality of basic illumination field facets, which provide a basic illumination of the object field via associated basic illumination pupil facets, but also a plurality of correction illumination field facets which allow the illumination of the object field to be corrected via associated correction illumination pupil facets, with a boundary shape of effectively illuminated areas of the correction illumination field facets having at least one inflection point.

The object mentioned at the outset is furthermore achieved according to the disclosure by an illumination optics for EUV microlithography for guiding an illumination light bundle from a radiation source to an object field with an aspect ratio between a longer field dimension and a shorter field dimension, the aspect ratio being greater than 1, including
  a field facet mirror with a plurality of field facets for setting defined illumination conditions in the object field;
  a following optics downstream of the field facet mirror for transmitting the illumination light into the object field;
  wherein the following optics includes a pupil facet mirror with a plurality of pupil facets, with the field facets being in each case individually allocated to the pupil facets so that portions of the illumination light bundle impinging upon in each case one of the field facets are guided on to the object field via the associated pupil facet;
wherein the field facet mirror not only includes a plurality of basic illumination field facets which provide a basic illumination of the object field via associated basic illumination pupil facets but also a plurality of correction illumination field facets which allow the illumination of the object field to be corrected via associated correction illumination pupil facets, with a boundary shape of effectively illuminated areas of the correction illumination field facets and/or effectively illuminated areas of the correction illumination pupil facets being influenced via a shading body, wherein a support structure supporting the shading body is disposed in a shaded space of the field facet mirror.

The object mentioned at the outset is furthermore achieved according to the disclosure by an illumination optics for EUV microlithography for guiding an illumination light bundle from a radiation source to an object field with an aspect ratio between a longer field dimension and a shorter field dimension, the aspect ratio being greater than 1, including
- a field facet mirror with a plurality of field facets for setting defined illumination conditions in the object field;
- a following optics downstream of the field facet mirror for transmitting the illumination light into the object field;
- wherein the following optics includes a pupil facet mirror with a plurality of pupil facets, with the field facets being in each case individually allocated to the pupil facets so that portions of the illumination light bundle impinging upon in each case one of the field facets are guided on to the object field via the associated pupil facet;

wherein the field facet mirror not only includes a plurality of basic illumination field facets which provide a basic illumination of the object field via associated basic illumination pupil facets but also a plurality of correction illumination field facets which allow the illumination of the object field to be corrected, with the correction illumination field facets being oriented relative to the correction illumination pupil facets in such a way that the portion of the illumination light bundle, which is transmitted from the correction illumination field facets to the correction illumination pupil facets, is not entirely transmitted by the correction illumination pupil facets but is cut off at the edges in a defined manner.

The object mentioned at the outset is furthermore achieved according to the disclosure by an illumination optics for EUV microlithography for guiding an illumination light bundle from a radiation source to an object field with an aspect ratio between a longer field dimension and a shorter field dimension, the aspect ratio being greater than 1, including
- a field facet mirror with a plurality of field facets for setting defined illumination conditions in the object field;
- a following optics downstream of the field facet mirror for transmitting the illumination light into the object field;
- wherein the following optics includes a pupil facet mirror with a plurality of pupil facets, with the field facets being in each case individually allocated to the pupil facets so that portions of the illumination light bundle impinging upon in each case one of the field facets are guided on to the object field via the associated pupil facet;

wherein the field facet mirror not only includes a plurality of basic illumination field facets which provide a basic illumination of the object field via associated basic illumination pupil facets but also a plurality of correction illumination field facets which allow the illumination of the object field to be corrected, with the correction illumination field facets being oriented relative to the correction illumination pupil facets in such a way that the portion of the illumination light bundle, which is transmitted from the correction illumination field facets to the correction illumination pupil facets, does not entirely reach the object field but is cut off at the edges in a defined manner.

The object mentioned at the outset is furthermore achieved according to the disclosure by an illumination optics for EUV microlithography for guiding an illumination light bundle from a radiation source to an object field with an aspect ratio between a longer field dimension and a shorter field dimension, the aspect ratio being greater than 1, including
- a field facet mirror with a plurality of field facets for setting defined illumination conditions in the object field;
- a following optics downstream of the field facet mirror for transmitting the illumination light into the object field;
- wherein the following optics includes a pupil facet mirror with a plurality of pupil facets, with the field facets being in each case individually allocated to the pupil facets so that portions of the illumination light bundle impinging upon in each case one of the field facets are guided on to the object field via the associated pupil facet;
- wherein the field facet mirror not only includes a plurality of basic illumination field facets which provide a basic illumination of the object field via associated basic illumination pupil facets but also a plurality of correction illumination field facets which allow the illumination of the object field to be corrected via associated correction illumination pupil facets;
- wherein the correction illumination field facets have an illumination light reflectivity which follows a predetermined pattern along the longer field facet dimension that deviates from a constant reflectivity in a defined manner;
- wherein a separate gray filter portions is provided on the correction illumination field facet;
- wherein in the gray filter portion are provided absorbing point structures with a constant area density, a variable reflectivity being achieved by varying the width of the gray filter portion perpendicular to the long field facet dimension. The bundle-guiding effect of these correction illumination field facets may be dynamically controllable.

The object mentioned at the outset is furthermore achieved according to the disclosure by an illumination optics for EUV microlithography for guiding an illumination light bundle from a radiation source to an object field with an aspect ratio between a longer field dimension and a shorter field dimension, the aspect ratio being greater than 1, including
- a field facet mirror with a plurality of field facets for setting defined illumination conditions in the object field;
- a following optics downstream of the field facet mirror for transmitting the illumination light into the object field;
- wherein the following optics includes a pupil facet mirror with a plurality of pupil facets, with the field facets being in each case individually allocated to the pupil facets so that portions of the illumination light bundle impinging upon in each case one of the field facets are guided on to the object field via the associated pupil facet;
- wherein the field facet mirror not only includes a plurality of basic illumination field facets which provide a basic illumination of the object field via associated basic illumination pupil facets but also a plurality of correction illumination field facets which allow the illumination of the object field to be corrected via associated correction illumination pupil facets;
- wherein the correction illumination field facets have an illumination light reflectivity which follows a predetermined pattern along the longer field facet dimension that deviates from a constant reflectivity in a defined manner;
- wherein a separate gray filter portion is provided on the correction illumination field facet;
- wherein the point structures in the gray filter portion are distributed with a varying area density. The bundle-guiding effect of these correction illumination field facets may be dynamically controllable.

The object mentioned at the outset is furthermore achieved according to the disclosure by an illumination optics for EUV microlithography for guiding an illumination light bundle from a radiation source to an object field with an aspect ratio between a longer field dimension and a shorter field dimension, the aspect ratio being greater than 1, including a field facet mirror with a plurality of field facets for setting defined illumination conditions in the object field;

a following optics downstream of the field facet mirror for transmitting the illumination light into the object field;

wherein the following optics includes a pupil facet mirror with a plurality of pupil facets, with the field facets being in each case individually allocated to the pupil facets so that portions of the illumination light bundle impinging upon in each case one of the field facets are guided on to the object field via the associated pupil facet;

wherein the field facet mirror not only includes a plurality of basic illumination field facets which provide a basic illumination of the object field via associated basic illumination pupil facets but also a plurality of correction illumination field facets which allow the illumination of the object field to be corrected via associated correction illumination pupil facets;

wherein the field facet mirror includes at least two similar correction illumination facets;

wherein the similar correction illumination field facets are allocated to correction illumination pupil facets which are point symmetric relative to a center of the pupil defined by the pupil facet mirror. The bundle-guiding effect of these correction illumination field facets may be dynamically controllable.

With respect to their individual structural features, the above-described illumination optical systems according to the disclosure may also be implemented in structural combinations which are different from those described above. If a dynamic controllability of the bundle-guiding effect or a switching of the field facet mirror between at least two modes of operation of the above-described illumination optical systems according to the disclosure is not required, the illumination optical systems can be improved in a way as discussed above with respect to the illumination optical systems according to the disclosure which have a dynamically controllable bundle-guiding effect or which are provided with a field facet mirror that is switchable between at least two modes of operation.

The advantages of an optical system including an illumination optics according to the disclosure and a projection optics for projecting an object field into an image field; the advantages of a projection exposure apparatus including an optical system of this type and an EUV radiation source for generating an illumination light bundle; the advantages of a production method including the steps:

providing a reticle;

providing a wafer with a coating which is light-sensitive for the illumination light;

projecting at least a portion of the reticle onto the wafer via the projection exposure apparatus according to the disclosure;

developing the light-sensitive layer on the wafer after exposure to the illumination light bundle;

and the advantages of a micro- or nanostructured component produced according to the disclosure correspond to those which have been explained with reference to the illumination optics according to the disclosure.

A method for correcting the illumination using the illumination optics according to the disclosure may include the following steps:

determining an intensity distribution or an angle distribution of an illumination of the object field via the illumination light bundle of the radiation source;

providing an arrangement of the correction illumination field facets and an allocation of the correction illumination pupil facets to these correction illumination field facets so as to obtain the desired intensity distribution or angle distribution;

wherein the correction illumination field facets are provided on the basis of a set of functions, with a set of correction illumination field facets with intensity variations across the field height being provided, the intensity variations corresponding to this set of functions.

Providing the arrangement of the correction illumination field facets and allocating the correction illumination pupil facets to these correction illumination field facets may in particular take place on the basis of a calculation. Alternatively, this may also take place on the basis of a previously generated calibration table in which are stored the arrangements of the correction illumination field facets and allocations of the correction illumination pupil facets to the correction illumination field facets which are in each case allocated to the respectively detected intensity distribution or angle distribution. The arrangement of the correction illumination field facets is calculated on the basis of a set of functions, wherein the correction illumination field facets may have effective illumination light reflectivities across the long field dimension which correspond to functions of this set of functions.

The intensity distribution or the angle distribution of the illumination of the object field can either be measured directly or in a derived form. A derived measurement may for instance take place by measuring the intensity distribution or the angle distribution of the illumination of the object field in a plane that is spaced from the object plane. Alternatively or in addition thereto, the intensity distribution or the angle distribution of the object field illumination may be determined in a derived manner by measuring other parameters, for instance a light distribution of adjustment radiation or carried-along radiation with different wavelengths, or by measuring indirect parameters such as the temperature increase of particular components or by measuring scattered light. The calculation of the arrangement of the correction illumination field facets may include the calculation of an arrangement of the correction illumination field facets on the field facet mirror and/or the calculation of a reflectivity pattern of individual or all correction illumination field facets, i.e. an effective form of these correction illumination field facets. The calculated arrangement of the correction illumination field facets may be provided by providing a correspondingly designed, completely new field facet mirror or by selecting defined correction illumination field facets of the already existing field facet mirror for instance via interchangeable stops.

When performing an illumination correction, one can select from among various modes of operation and therefore from among various arrangements of active correction illumination field facets.

The advantages of this illumination correction method correspond to those which have already been explained above with reference to the illumination optics according to the disclosure.

BRIEF DESCRIPTION OF THE DRAWINGS

Embodiments of the disclosure will hereinafter be explained in more detail via the drawing in which

FIG. 27 is a similar view to FIG. 21 of the pupil facet mirror with an arrangement of illuminated pupil facets;

FIG. 28 is a similar view to FIG. 21 of the pupil facet mirror with another arrangement of illuminated pupil facets;

FIG. 29 is a diagrammatic view of field facets which are allocated to pupil facets via illumination channels in various ways;

DETAILED DESCRIPTION

Figure 1:
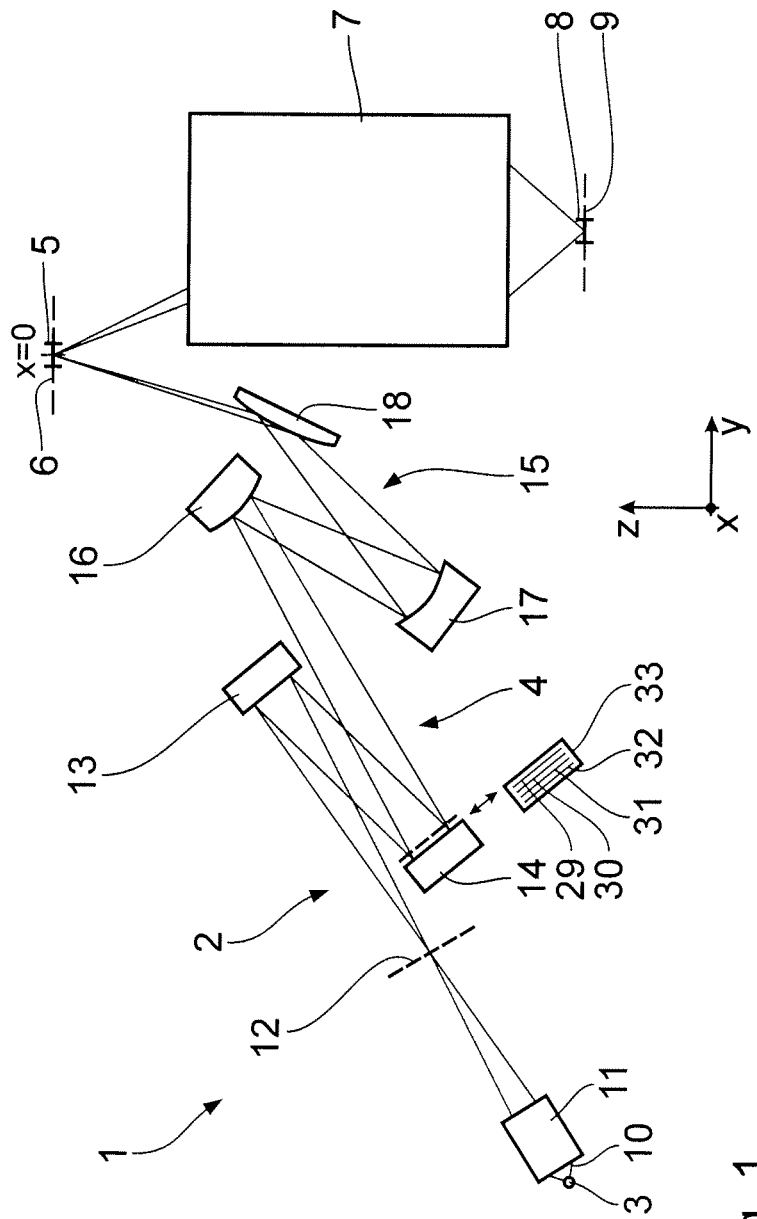
FIG. 1 is a diagrammatic meridional section through a microlithographic projection exposure apparatus including an illumination optics and a projection optics.

FIG. 1 is a diagrammatic meridional section through a microlithographic projection exposure apparatus 1. An illumination system 2 of the projection exposure apparatus 1 includes a radiation source 3 and an illumination optics 4 for illuminating an object field 5 in an object plane 6. In this process, a reticle is illuminated which is arranged in the object field 5 and is not shown in FIG. 1, the reticle being provided with a structure to be projected via the projection exposure apparatus 1 for the production of micro- or nanostructured semiconductor components. A projection optics 7 serves for imaging the object field 5 into an image field 8 in an image plane 9. The structure on the reticle is imaged onto a light-sensitive layer of a wafer which is arranged in the region of the image field 8 in the image plane 9 and is not shown in the drawing.

The radiation source 3 is an EUV radiation source with an emitted useful radiation in the range between 5 nm and 30 nm. The radiation source 3 may be a plasma source, for instance a GDPP source (gas discharge produced plasma) or an LPP source (laser produced plasma). Other EUV radiation sources, for instance those based on a synchrotron, are conceivable as well. EUV radiation 10 emitted by the radiation source 3 is collected by a collector 11. A corresponding collector is for instance disclosed in EP 1 225 481 A. Downstream of the collector 11, the EUV radiation 10 propagates through an intermediate focal plane 12 before impinging upon a field facet mirror 13. The field facet mirror 13 is arranged in a plane of the illumination optics 4 which is optically conjugated with the object plane 6.

The EUV radiation 10 is hereinafter also referred to as illumination light or as imaging light.

Downstream of the field facet mirror 13, the EUV radiation 10 is reflected by a pupil facet mirror 14. The EUV radiation 10 impinges upon the two facet mirrors 13, 14 at an angle of incidence which is smaller than or equal to 25°. The two facet mirrors are thus exposed to the EUV radiation 10 within the range of a normal-incidence operation. The pupil facet mirror 14 is arranged in a plane of the illumination optics 4 which is optically conjugated with a pupil plane of the projection optics 7. Via the pupil facet mirror 14 and an imaging optical assembly in the form of a transmission optics 15 including mirrors which are denoted by 16, 17 and 18 in the order of the beam path of the EUV radiation 10, field facets 19 (cf. FIG. 2) of the field facet mirror 13 are imaged into the object field 5 in such a way as to overlap each other. The last mirror 18 of the transmission optics 15 is a grazing incidence mirror. The transmission optics 15, in combination with the pupil fact mirror 14, is also referred to as following optics for transmitting the EUV radiation 10 from the field facet mirror 13 to the object field 5.

A Cartesian xyz coordinate system is hereinafter used to facilitate the description of positional relationships. The x-axis extends towards the viewer perpendicular to the drawing plane of FIG. 1. The y-axis extends towards the right of FIG. 1. The z-axis extends upwards in FIG. 1.

The reticle, which is held in place by a reticle holder (not shown), and the wafer, which is held in place by a wafer holder (not shown), are scanned synchronously in the y-direction when the projection exposure apparatus 1 is in use.

In the illustrated embodiment, the object field 5 has an arcuate shape, with the reticle (cf. the reticle 20 in FIG. 22) having a corresponding arcuate shape. The object field 5 can therefore hereinafter be explained via the illustration of the reticle 20 in FIG. 22. The object field 5 has the shape of a ring segment which covers a sector angle S which amounts to approximately 75° in the illustrated embodiment. Other sector angles S are conceivable as well. The object field 5 is bounded by an inner arc side 21 with a radius Ri, an outer arc side 22 with a radius Ra and two radial sides which bound the sides of the object field 5, namely a radial side 23 on the left of FIG. 2 and a radial side 24 on the right of FIG. 22. Between the two centers of the radial sides 23, 24, the object field 5 has an x-extension of $x_0$. Between the two centers of the arc sides 21, 22, the object field 5 has a y-extension of $y_0$. The aspect ratio $x_0/y_0$ of the object field 5 is considerably greater than 1. In the embodiment illustrated in FIG. 22, this aspect ratio $x_0/y_0$ is approximately 7:1. Other aspect ratios are conceivable as well, for instance an aspect ratio of 13:1. Due to these aspect ratios, the x-axis is also referred to as long field axis while the y-axis is referred to as short field axis. A particular x-coordinate in the object field 5 is also referred to as field height. The rectangular field facets 19 of the field facet mirror 13 (cf. FIG. 2) have an x/y aspect ratio which corresponds to the $x_0/y_0$ aspect ratio of the object field 5.

Figure 2:
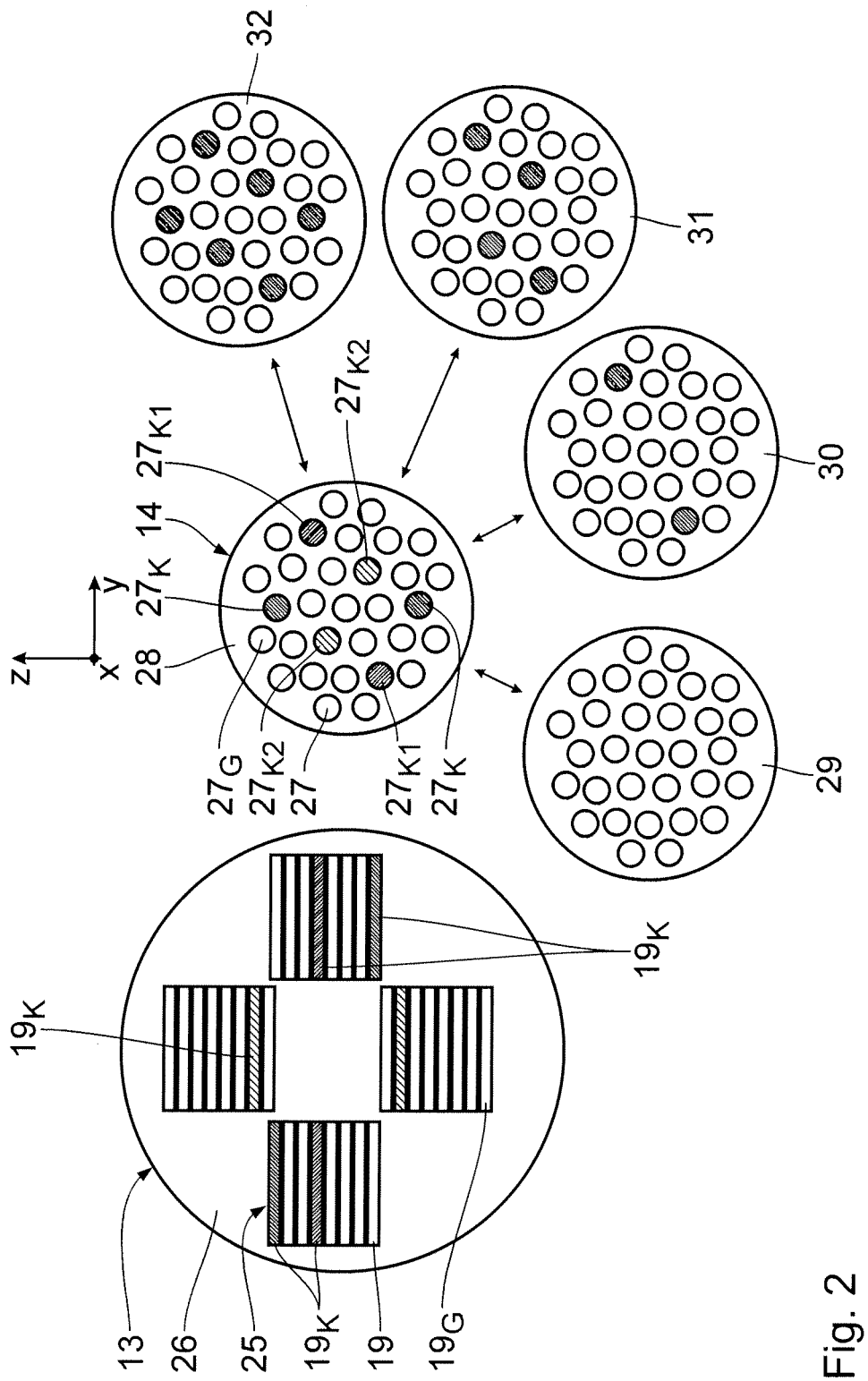
FIG. 2 is a diagrammatic plan view of a field facet mirror and of a pupil facet mirror of the illumination optics according to FIG. 1, with several stops being allocated to the pupil facet mirror for covering correction illumination pupil facets.

The field facets 19 of the field facet mirror 13 are combined in field facet blocks 25 including a plurality of field facets 19, namely in each case eight field facets 19 in the illustrated embodiment. FIG. 2 shows a total of four field facet blocks 25 of this type. In practical application, there is a much higher number of such field facet blocks 25 so that the field facet mirror 13 includes several hundred field facets 19. The field facet blocks 25 are arranged on a field facet carrier 26 which is adjustable in several degrees of freedom in practical application. Depending on the design of the field facet mirror 13, the field facet blocks 25 and/or the field facets 19 within the field facet blocks 25 may also be adjustable relative to the field facet carrier 26.

The pupil facet mirror 14 (cf. FIG. 2) has a plurality of round pupil facets 27 which are for instance arranged on a pupil facet carrier 28 in an hexagonal close packing The field facets 19 and the pupil facets 27 may have an imaging effect and may for instance have a spherically concave shape.

The pupil facet carrier 28 can be adjustable corresponding to the field facet carrier 26. Similar to the pupil facet carrier 28, the individual pupil facets 27 may alternatively or additionally be adjustable relative to the pupil facet carrier 28 as well.

The highly reflective coating on the facets is a multilayer coating in practical application with alternating molybdenum and silicon layers. The facets 19, 27 are mirror facets for the EUV radiation 10. In order to adjust individual field facets 19 and/or individual pupil facets 27, these facets may individually be connected to associated actuators. These actuators may be designed in such a way as to allow the individual field facets to be tilted about two axes which are disposed in the reflection plane of the respective facet.

The field facets 19 are in each case individually allocated to the pupil facets 27 so that portions of the illumination light bundle of the EUV radiation 10 impinging upon a respective one of the field facets 19 are transmitted on to the object field 5 via the associated pupil facet 27. These two facet mirrors 13, 14 therefore define a plurality of illumination channels which guide the EUV radiation 10 to the object field 5 in separate channels. The diagrammatically illustrated embodiment according to FIG. 2 has a total of thirty-two such illumination channels. The radiation source 3 is imaged onto the pupil facets 27 in each of the illumination channels.

The field facets 19 and the pupil facets 27 are divided into in each case two facet types. Basic illumination field facets $19_G$ are shown blank in FIG. 2. Correction illumination field facets $19_K$ are shown hatched in FIG. 2. Basic illumination pupil facets $27_G$, which are illustrated as blank circles in FIG. 2, are allocated to the basic illumination field facets $19_G$ via illumination channels.

Correction illumination pupil facets $27_K$, which are shown hatched in FIG. 2, are allocated to the correction illumination field facets $19_K$.

The basic illumination field facets $19_G$ provide a basic illumination of the object field 5 via basic illumination channels via the associated basic illumination pupil facets $27_G$. The correction illumination field facets $19_K$ provide a correction illumination of the object field 5 via correction illumination channels via the associated correction illumination pupil facets $27_K$.

The field facets 19 of the field facet mirror 13 to be used as basic illumination field facets $19_G$ and the field facets 19 to be used as correction illumination field facets $19_K$ are selected depending on the geometry and the intensity distribution during exposure of the field facet mirror 13 to the illumination light bundle of the EUV radiation 10, and on the predetermined desired illumination of the object field 5. Suitable correction illumination field facets $19_K$ are for instance those whose intensity is not sufficient for providing a basic illumination or which have an intensity distribution which is not acceptable for providing a basic illumination. Suitable correction illumination field facets $19_K$ are for instance field facets 19 near the edge or field facets 19 which have portions that are not exposed to the EUV radiation at all or only to an attenuated EUV radiation due to shadings, for example.

A plurality of stops 29, 30, 31, 32 (cf. FIG. 2) is allocated to the pupil facet mirror 14 which are provided in a stop-changing holder 33 (cf. FIG. 1). Via the stop-changing holder 33, the stops 29 to 32 may individually be displaced between a rest position illustrated by a continuous line in FIG. 1 and a stop position illustrated by a dashed line in FIG. 1 in front of the mirror surface of the pupil facet mirror 14. In the stop position, the stops 29 to 32 ensure that the EUV radiation 10 propagates along the defined basic illumination channels. Furthermore, the stops 29 to 32 allow for a selection of the correction illumination pupil facets $27_K$ to be used for correction illumination.

When in the stop position, the stop 29 permits a correction illumination via all of the six correction illumination pupil facets $27_K$ shown in FIG. 2. This results in a superimposed illumination of the object field 5 via all of the basic illumination channels and via all of the correction illumination channels at the same time.

When in the stop position, the stop 30 blocks out two correction illumination pupil facets denoted by $27_{K1}$ in FIG. 2. The object field 5 is then exposed to superimposed illumination via all basic illumination channels and the remaining correction illumination channels.

When in the stop position, the stop 31 blocks out two further correction illumination pupil facets $27_{K2}$ in addition to the correction illumination pupil facets $27_{K1}$. When using the stop 31, the object field 5 is then exposed to superimposed radiation via the basic illumination channels and the two remaining correction illumination channels.

When in the stop position, the stop 32 blocks out all of the correction illumination pupil facets $27_k$. The object field 5 is then exposed to superimposed illumination via the basic illumination channels only.

Consequently, the stops 29 to 31 allow portions of the illumination light bundle of the EUV radiation 10, which are allocated to in each case different groupings of the correction illumination field facets $19_K$, to pass through to the object field 5. Other transmitted groupings are of course conceivable as well by designing additional stops in a corresponding manner.

Just as the basic illumination field facets $19_G$, the correction illumination field facets $19_K$ may have a constant reflectivity across their surface. Alternatively, at least selected correction illumination field facets $19_K$ may be provided with a reflectivity which varies across their facet surface. These correction illumination field facets $19_K$ in particular have a reflectivity for the EUV radiation 10, the reflectivity following a predetermined pattern along the long field dimension that deviates from a constant reflectivity in a defined manner.

Figure 3:
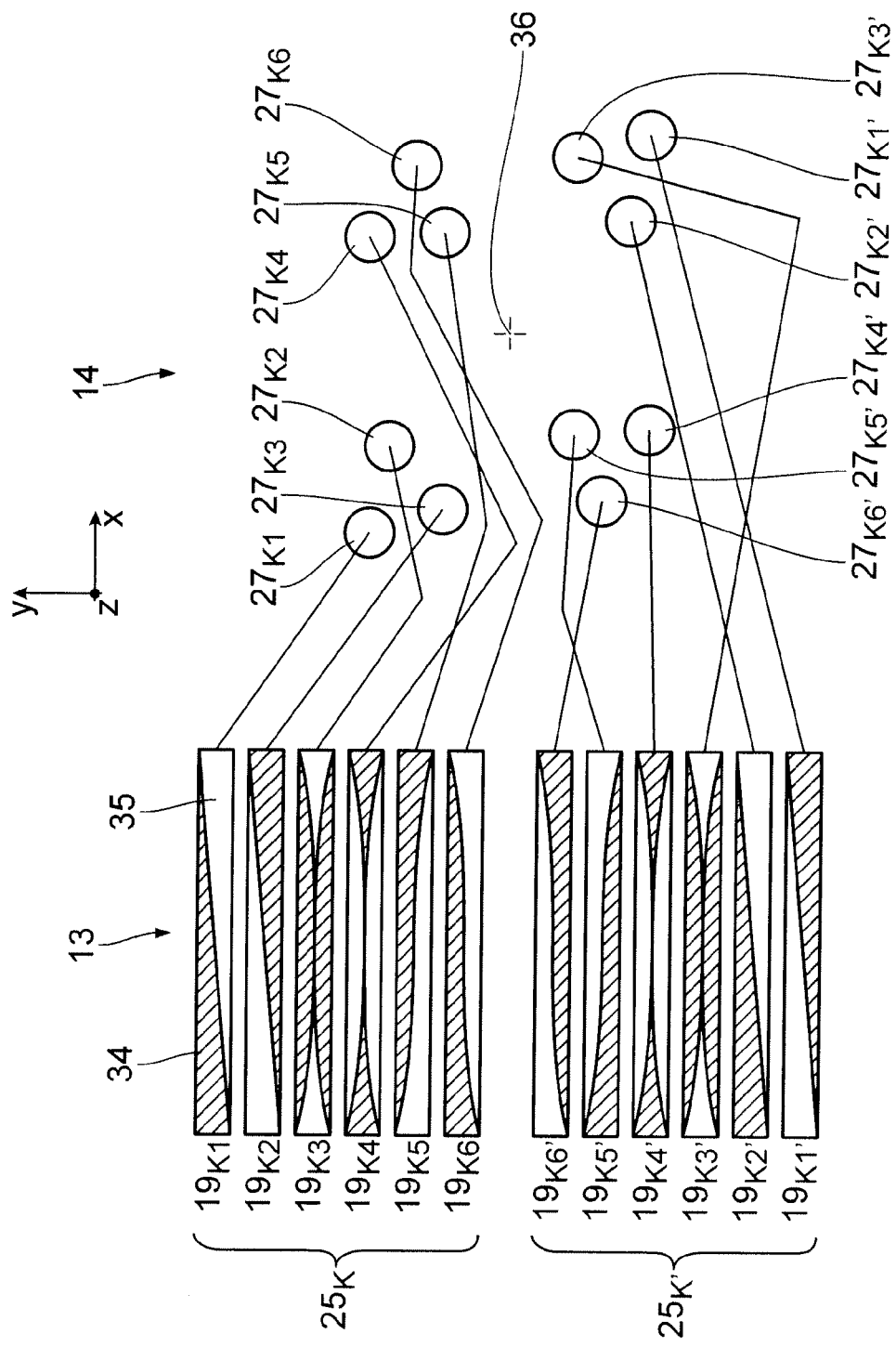
FIG. 3 is a plan view of various types of correction illumination field facets together with their respectively allocated correction illumination pupil facets.

FIG. 3 shows examples of such correction illumination field facets $19_{K1}$ to $19_{K6}$ and $19_{K1'}$ to $19_{K6'}$. The correction illumination field facets $19_{K1}$ to $19_{K6}$ are combined in a correction illumination field facet block $25_K$. The correction illumination field facets $19_{K1'}$, to $19_{K6'}$ are combined in a correction illumination field facet block $25_{K'}$. In the portions shown hatched, these correction illumination field facets $19_{K1}$ to $19_{K6}$ and $19_{K1'}$ to $19_{K6'}$ are not provided with coatings that are highly reflective of the EUV radiation 10. These portions are hereinafter referred to as attenuation portions 34. Reflection portions 35 of the correction illumination field facets $19_{K1}$ to $19_{K6}$ and $19_{K1'}$ to $19_{K6'}$ are shown blank in FIG. 3. The shapes of the attenuation portions 34 are different in each of the correction illumination field facets $19_{K1}$ to $19_{K6}$. The correction illumination field facets $19_{K1}$ and $19_{K1'}$ have similarly shaped attenuation portions 34. The same applies to the pairs $19_{K2}/19_{K2'}$ to $19_{K6}/19_{K6'}$ of the correction illumination field facets. The two field facet blocks $25_K$ and $25_{K'}$ are arranged mirror-symmetrically relative to an x-z mirror symmetry plane.

Due to the differently designed attenuation portions 34 of the correction illumination field facets $19_{K1}$ to $19_{K6}$, the correction illumination field facets $19_{K1}$ to $19_{K6}$ attenuate the EUV radiation 10 along the x-direction to in each case different extents.

The correction illumination field facet $19_{K1}$ completely attenuates the EUV radiation 10 at the left-hand edge of FIG. 3. The attenuation decreases linearly towards the right-hand edge, with the result that the EUV radiation 10 is reflected at the right-hand edge with the highest possible efficiency.

The correction illumination field facet $19_{K2}$ has an attenuation portion 34 which results in an exactly inverse attenuation pattern, i.e. the EUV radiation 10 is not attenuated at the left-hand edge of FIG. 3 while at the right-hand edge, it is attenuated to the greatest possible extent.

The correction illumination field facet 19 has two attenuation portions 34 which, according to FIG. 3, are crescent-shaped when seen from above and from below and touch in the center of the correction illumination field facet $19_{K3}$. The correction illumination field facet $19_{K3}$ therefore follows an attenuation pattern in the x-direction with a minimum attenuation at the left-hand edge of FIG. 3 which increases to a maximum attenuation at half x-height before decreasing again to a minimum attenuation at the right-hand edge.

Compared to the correction illumination field facet $19_{K3}$, the correction illumination field facet $19_{K4}$ has an inverse attenuation pattern for the EUV radiation in the x-direction. The correction illumination field facets $19_{K3}$ and $19_{K4}$ generate a parabolic attenuation pattern in the x-direction.

The correction illumination field facet $19_{K5}$ has an attenuation pattern in the x-direction with a minimum attenuation for the EUV radiation 10 at the left-hand edge of FIG. 3 which increases to a maximum attenuation at the right-hand edge. Between the two edges, the attenuation is a non-linear function of the x-coordinate. The attenuation is the result of a continuous monotonic function. Other patterns of the attenuation function, in particular those with at least one minimum or at least one maximum, and non-continuous and/or non-monotonic functions are conceivable as well.

The correction illumination field facet $19_{K6}$ has an attenuation pattern in the x-direction which is inverse compared to that of the correction illumination field facet $19_{K5}$.

In the attenuation portions 34, the correction illumination field facets $19_{K1}$ to $19_{K6}$ and $19_{K1'}$ to $19_{K6'}$ have a reflectivity for the EUV radiation 10 which is much smaller than 10%; in the illustrated embodiment, the reflectivity is smaller than 0.1% of the reflectivity in the reflection portions 35 of the facets.

The pairs of corrective illumination field facets $19_{K1}/19_{K1'}$ to $19_{K6}/19_{K6'}$ form in each case a group of typified correction illumination field facets which follow the same reflectivity pattern across the long field dimension, in other words along the x-axis.

The pairs $19_{K1}/19_{K1'}$ to $19_{K6}/19_{K6'}$ of the correction illumination field facets are allocated to pairs of correction illumination pupil facets $27_{K1}/27_{K1'}$ to $27_{K6}/27_{K6'}$ which are in each case point symmetric relative to a center 36 of the pupil facet mirror 14.

Stops in the manner of the stops 29 to 32 interacting with the correction illumination field facets $19_{K1}$ to $19_{K1'}$, $19_{K6}$ to $19_{K6'}$ are configured in such a way that the pairs $19_{K1}/19_{K1'}$ to $19_{K6}/19_{K6'}$ are always shaded in pairs. This prevents telecentricity variations of the object field illumination which may be caused via the correction illumination channels.

The telecentricity of the illumination of the object field 5 is defined as follows:

For each field point of the illuminated object field 5 is defined a central ray of a light bundle allocated to this field point. The central ray has the energy-weighted direction of the light bundle emanating from this field point. In the ideal case, the central ray of each field point is parallel to the chief ray defined by the illumination optics or the projection optics.

The direction of the chief ray $\vec{s}_0$ (x,y) is known from the design data of the illumination optics 4 or of the projection optics 7. The chief ray at a field point is defined by the connection line between the field point and the central point of the entrance pupil of the projection optics 7. The direction of the central ray at a field point x, y in the object field 5 in the object plane 6 is obtained as follows:

$$\vec{s}(x,y) = \frac{1}{\tilde{E}(x,y)} \int dudv \binom{u}{v} E(u,v,x,y)$$

E (u, v, x, y) is the energy distribution for the field point as a function of the pupil coordinates u, v, i.e. as a function of the illumination angle seen by the respective field point x, y.

$\tilde{E}(x,y) = \int dudv E(u,v,x,y)$ is the total energy impinging upon the point x, y.

For instance, a central object field point $x_0$, $y_0$ sees the radiation of partial radiation bundles from directions u, v which are defined by the penetration point of the respective partial radiation bundles passing through the pupil planes of the illumination optics 4. At this illumination setting, the central ray s extends along the chief ray only if the different energies or intensities, respectively, of the partial radiation bundle combine to form an integrated central ray direction which is parallel to the chief ray direction. This is only the case under ideal circumstances. In practice, there is a deviation between the central ray direction $\vec{s}(x, y)$ and the chief ray direction $\vec{s}_0(x,y)$ which is referred to as telecentricity error $\vec{t}(x, y)$:

$$\vec{t}(x,y) = \vec{s}(x,y) - \vec{s}_0(x,y)$$

In the practical application of the projection exposure apparatus 1, it is not the static telecentricity error at a particular object field that is to be corrected but the scan-integrated telecentricity error at $x=x_0$. This telecentricity error is obtained as follows:

$$\vec{T}(x_0) = \frac{\int dy \tilde{E}(x_0, y) \vec{t}(x_0, y)}{\int dy \tilde{E}(x_0, y)}.$$

In other words, the telecentricity error is corrected which is integrated by a point (x, e.g. $x_0$) on the reticle moving through the object field 5 in the object plane 6 during the scanning process, wherein a difference is made between an x-telecentricity error (tx) and a y-telecentricity error (ty). The y-telecentricity error is defined as a deviation of the central ray from the chief ray perpendicular to the scanning direction. The x-telecentricity error is defined as the deviation of the central ray from the chief ray in the scanning direction.

In an alternative embodiment of correction illumination field facets (not shown), there are groups of in each case four correction illumination field facets $19_K$ with the same x-pattern of the EUV reflectivities corresponding to the pairs $19_{K1}/19_{K1'}$ to $19_{K6}/19_{K6'}$ of the embodiment according to FIG. 3. These groups of four correction illumination field facets are allocated, via illumination channels, to groups of four correction illumination pupil facets which are equally distributed around a center 36 of the pupil facet mirror 14 so that for instance an ellipticity $E_{0°/90°}$ is maintained by switching on such a group of four correction illumination channels via stops. Strictly speaking, the center 36 is the center of the pupil of the illumination optics 4, the pupil being defined by the pupil facet mirror 14.

The ellipticity is another parameter for determining the quality of illumination of the object field 5 in the object plane 6. The determination of the ellipticity helps to obtain more precise information in terms of the distribution of energy or intensity, respectively, across the entrance pupil of the projection optics 7. To this end, the entrance pupil is divided into eight octants which are numbered in an anticlockwise direction from $O_1$ to $O_8$, as is common practice in mathematics. The contribution of energy or intensity made by the octants $O_1$ to $O_8$ of the entrance pupil to the illumination of a field point is hereinafter referred to as energy or intensity contribution $I_1$ to $I_8$.

The following quantity is referred to as −45°/45° ellipticity (Elly, $E_{-45°/45°}$):

$$E_{-45°/45°} = \frac{I1 + I2 + I5 + I6}{I3 + I4 + I7 + I8}$$

The following quantity is referred to as 0°/90° ellipticity (Ellx, $E_{0°/90°}$):

$$E_{0°/90°} = \frac{I1 + I8 + I4 + I5}{I2 + I3 + I6 + I7}.$$

Corresponding to the above description of the telecentricity error, the ellipticity can also be determined for a particular object field point $x_{FP}$, $y_{FP}$ or, alternatively, for a scan-integrated illumination. ($x=x_{FP}$, y-integrated).

The attenuation portions 34 on the correction illumination field facets can be produced by applying masks to the location of the attenuation portions 34 during a reflective coating of the facets, the masks covering the attenuation portions 34 in such a way that they are not provided with a reflective coating. The reflective coating is then only applied to the reflection portions 35.

A functional reflectivity pattern, depending on the x-dimension, of the correction illumination field facets may be a linear function of x, such as in the case of the correction illumination field facets $19_{K1}$, $19_{K1'}$, or a quadratic function of x, such as in the case of the correction illumination field facets $19_{K2}$ to $19_{K2'}$. Other polynomial x-functions, for instance functions with a higher power of x, are conceivable as well. Sinusoidal or cosinusoidal x-functions are conceivable as well, for instance when performing a Fourier analysis of a reflectivity dependence of the correction illumination field facets $19_K$ on the x-dimension. As a general rule, the various correction illumination field facets, for instance the correction illumination field facets $19_{K1}$ to $19_{K6}$, can be used to generate a set of reflectivity dependences which corresponds to a set of orthogonal functions, the reflectivity being a function of x. This allows virtually any desired illumination corrections of illumination parameters to be performed in the object field 5, in particular with respect to the illumination parameters telecentricity and ellipticity.

Figure 4:
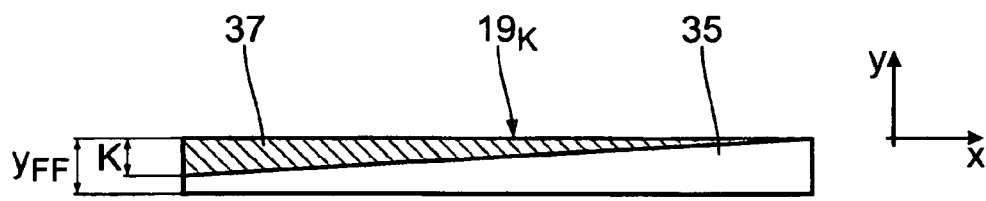
FIG. 4 is a plan view of another embodiment of a correction illumination field facet.

FIG. 4 shows another embodiment of a correction illumination field facet $19_K$ which may for instance replace the correction illumination field facets according to FIG. 2 or 3. The correction illumination field facet $19_K$ according to FIG. 4 has an attenuation portion in the form of a wedge-shaped gray filter portion 37 which is separate from the reflection portion 35.

In contrast to the correction illumination field facets $19_{K1}/19_{K1'}$ of the embodiment according to FIG. 3, a maximum width K of the attenuation portion 37 in the embodiment according to FIG. 4 is smaller at the left-hand edge of FIG. 4 than a width $y_{FF}$ of the correction illumination field facet $19_K$ in the y-direction. The correction illumination field facet $19_K$ therefore also has a reflectivity other than 0 at the left-hand edge of FIG. 4. This reflectivity increases linearly from the left to the right corresponding to the increasing width of the reflection portion 35.

Figure 5:
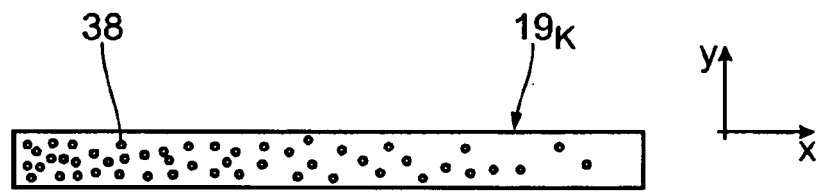
FIG. 5 is a plan view of another embodiment of a correction illumination field facet.

FIG. 5 shows another embodiment of a correction illumination field facet $19_K$ which may replace the correction illumination field facets according to FIGS. 2 to 4. The correction illumination field facet $19_K$ according to FIG. 5 is a gray filter as well, the gray filter having a reflectivity which is variable along the x-dimension. In the embodiment according to FIG. 5, the gray filter is formed by absorbing point structures 38 covering the entire reflective surface of the correction illumination field facet $19_K$, the absorbing point structures 38 being distributed in a predefined manner. The point structures 38 may have typical diameters in the range between 50 μm and 150 μm.

In the example of the correction illumination field facet $19_K$ according to FIG. 5, the area density of the point structures 38 decreases when seen from the left to the right, with the result that the reflectivity variation in the embodiment according to FIG. 5 approximately corresponds to that of the embodiment according to FIG. 4. In the embodiment according to FIG. 5, the point structures 38 are distributed across the entire reflective surface of the correction illumination field facet $19_K$. Alternatively, the point structures 38 may be arranged with a constant area density in an attenuation portion which is separate from the remaining reflection portion, with the attenuation portion for instance being formed corresponding to the attenuation portion 34 of the arrangements of the correction illumination field facets $19_{K1}$ to $19_{K6}$ according to FIG. 3.

As an alternative to the attenuation portions 34 in which the reflectivity of the correction illumination field facets is reduced from the outset, for instance when no reflective coating is applied, it is conceivable as well to provide attenuation portions on the correction illumination field facets 19 via variable shading bodies which are in particular actively displaceable, for instance via actuators. Shading bodies of this type may be held in place via a support structure which is disposed in a space 39 that is shaded due to the layout of the field facet mirror 13.

Figure 6:
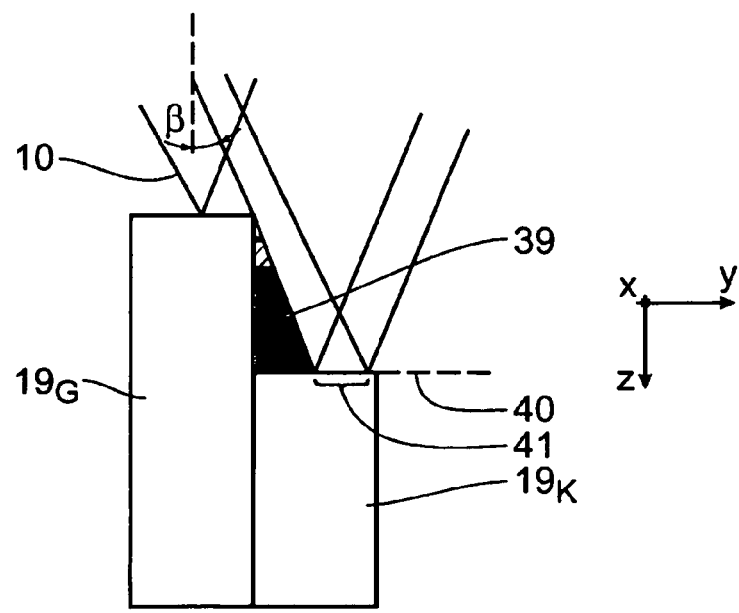
FIG. 6 is a side view of two illuminated field facets of the field facet mirror which are staggered relative to each other with respect to a total reflection plane, with the staggered arrangement and an oblique illumination forming a shaded space.

FIG. 6 shows a space 39 which is shaded in this manner, the space 39 being formed by a field facet 19 which is arranged on the left of FIG. 6, for instance a basic illumination field facet $19_G$, and projects beyond the adjacent correction illumination field facet $19_K$ shown on the right of FIG. 6 with respect to a reflection plane 40 of the associated field facet mirror. The shaded space 39, in which may be disposed the support structure for the variable shading body, is then created by the EUV radiation 10 which impinges upon the field facet mirror including the field facets $19_G$, $19_K$ at an angle β relative to the xz-plane, i.e. obliquely to the reflection plane 40. The variable shading body may then shade a reflection portion 41 of the correction illumination field facet $19_K$ with an attenuation that is variable in the x-dimension. The x-axis extends perpendicular to and into the drawing plane of FIG. 6. The y-axis extends towards the right of FIG. 6. The z-axis extends downwards in FIG. 6.

The shading body is not shown in FIG. 6. The shading body may for instance be a stop which extends along the x-dimension and is variably movable into and out of the reflection portion 41.

Figure 7:
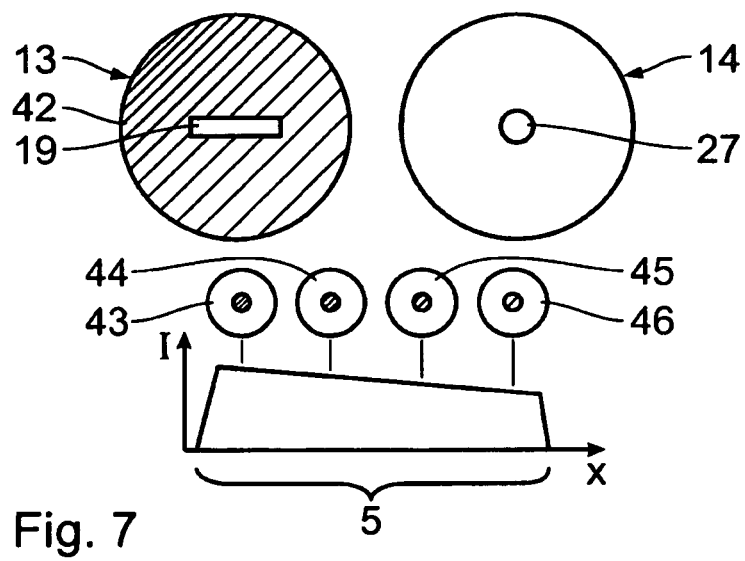
FIG. 7 is a diagrammatic view of the illumination of an object field of the illumination optics performed by an illumination channel having a single field facet and a single pupil facet allocated thereto, wherein the facets are in each case shown in a plan view while a field dependence of the illumination is additionally shown in a diagram.
Figure 8:
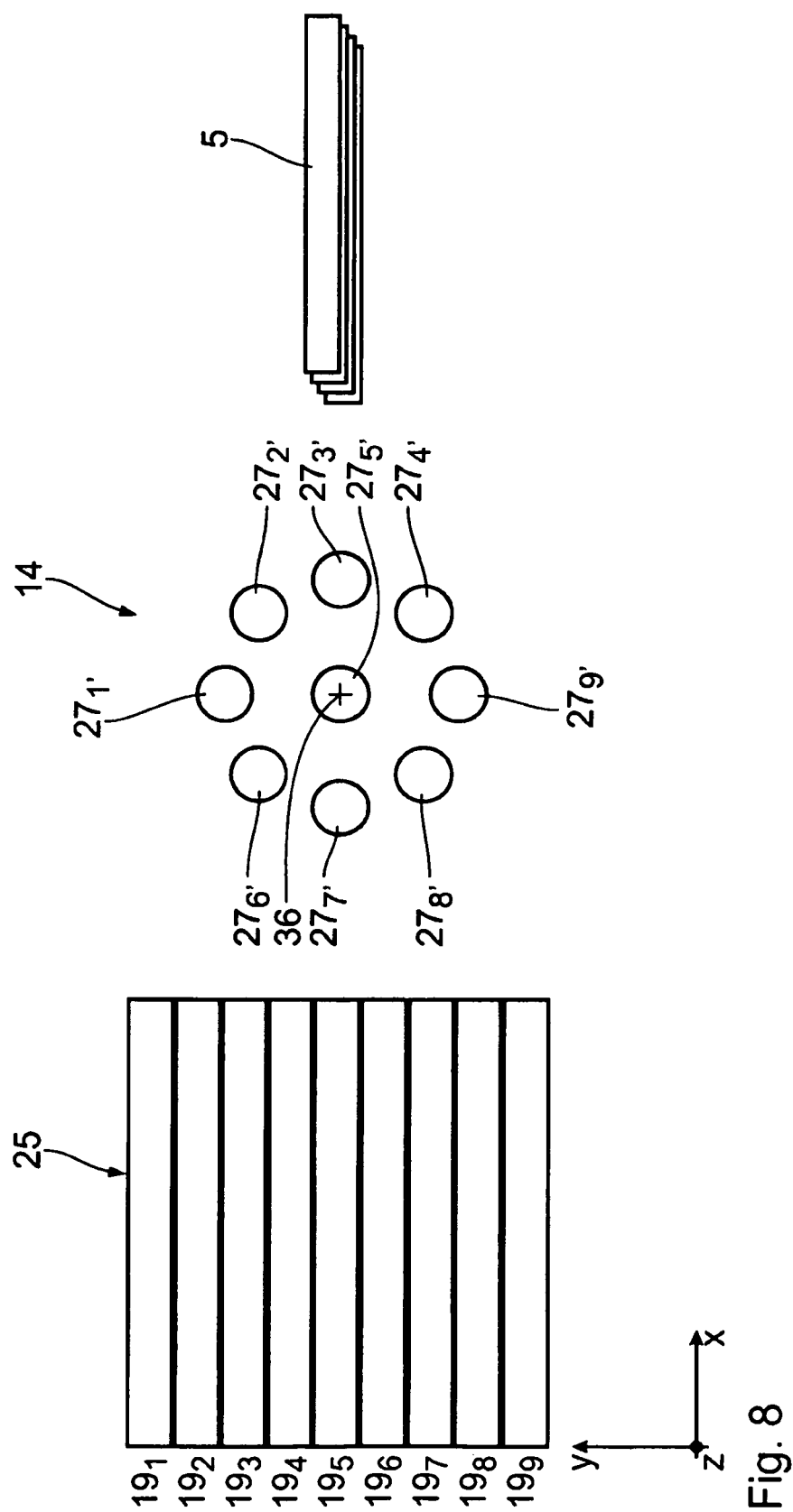
FIG. 8 is a diagrammatic view of a total of nine superimposed illumination channels including nine field facets and nine associated pupil facets in the object field, wherein the facets and the illumination channels, which are superimposed in the object field, are in each case shown in a plan view.

The following is a description, via FIGS. 7 and 8, of how an inhomogeneous illumination to be corrected may develop across the x-axis of the object field 5.

FIG. 7 is a diagrammatic view of the field facet mirror 13 with a single field facet 19. The radiation source 3 illuminates the field facet mirror 13 in a round illumination area 42. This illumination is not homogeneous. The illumination intensity decreases homogeneously in the illumination area 42 from the top left to the bottom right of FIG. 7. As a result, the field facet 19 is exposed to EUV radiation 10 whose intensity decreases from the left to the right of FIG. 7.

FIG. 7 further shows a diagrammatic view of the pupil facet mirror 14 with a single pupil facet 27. The field facet 19 and the pupil facet 27 define an illumination channel. An intensity distribution I(x) across the x-dimension of the object field 5 is shown in a diagram at the bottom of FIG. 7. It is assumed that the object field 5 is illuminated by the only illumination channel shown in FIG. 7. The left-hand edge of FIG. 7 is then exposed to the greatest intensity and sees an illumination angle distribution which is shown at 43 in FIG. 7. Three additional illumination angle distributions are diagrammatically shown at 44 to 46 which see object field points that have moved further to the right of FIG. 7, in other words in the x-direction. The four illumination angle distributions 43 to 46 have in each case the same illumination directions. The associated object points are therefore all exposed to illumination from the same illumination directions, namely from the direction of the only pupil facet 27. When seen from the left to the right, however, the object field points are exposed to a decreasing illumination intensity.

As this illumination variation occurs in the x-direction, i.e. perpendicular to the y-direction or scanning direction, this illumination variation is maintained even when the reticle is scanned by the object field 5. This intensity variation I(x) therefore is desirably kept as low as possible. This low intensity variation I(x) corresponds to a small value of the uniformity U(x) which is defined as follows:

$$U(\%) = 100 \frac{I(x) - I(x=0)}{I(x=0)}$$

x=0 corresponds to an x-position, in other words a field height, in the center of the object field 5.

FIG. 8 illustrates the superposition of a total of nine different illumination channels with field facets $19_1$ to $19_9$ (numbered from the top to the bottom) of a field facet block 25 and the associated pupil facets $27_{1'}$ to $27_{9'}$. The pupil facet $27_{5'}$ is arranged in the center 36 of the pupil facet mirror 14. All illumination channels are superimposed in the object field 5, which is indicated on the right of FIG. 8 by stacked rectangles. An intensity variation of the illumination of all field facets $19_1$ to $19_9$ occurring from the left to the right cannot be compensated by the superposition in the object field 5 but adds up in the object field 5 if this variation follows in each case the same monotonic pattern in the x-direction. A compensation can be performed via the correction illumination field facets which have been explained above via FIGS. 2 to 6, and by the correction illumination field facets which will be explained in the following.

Figure 9:
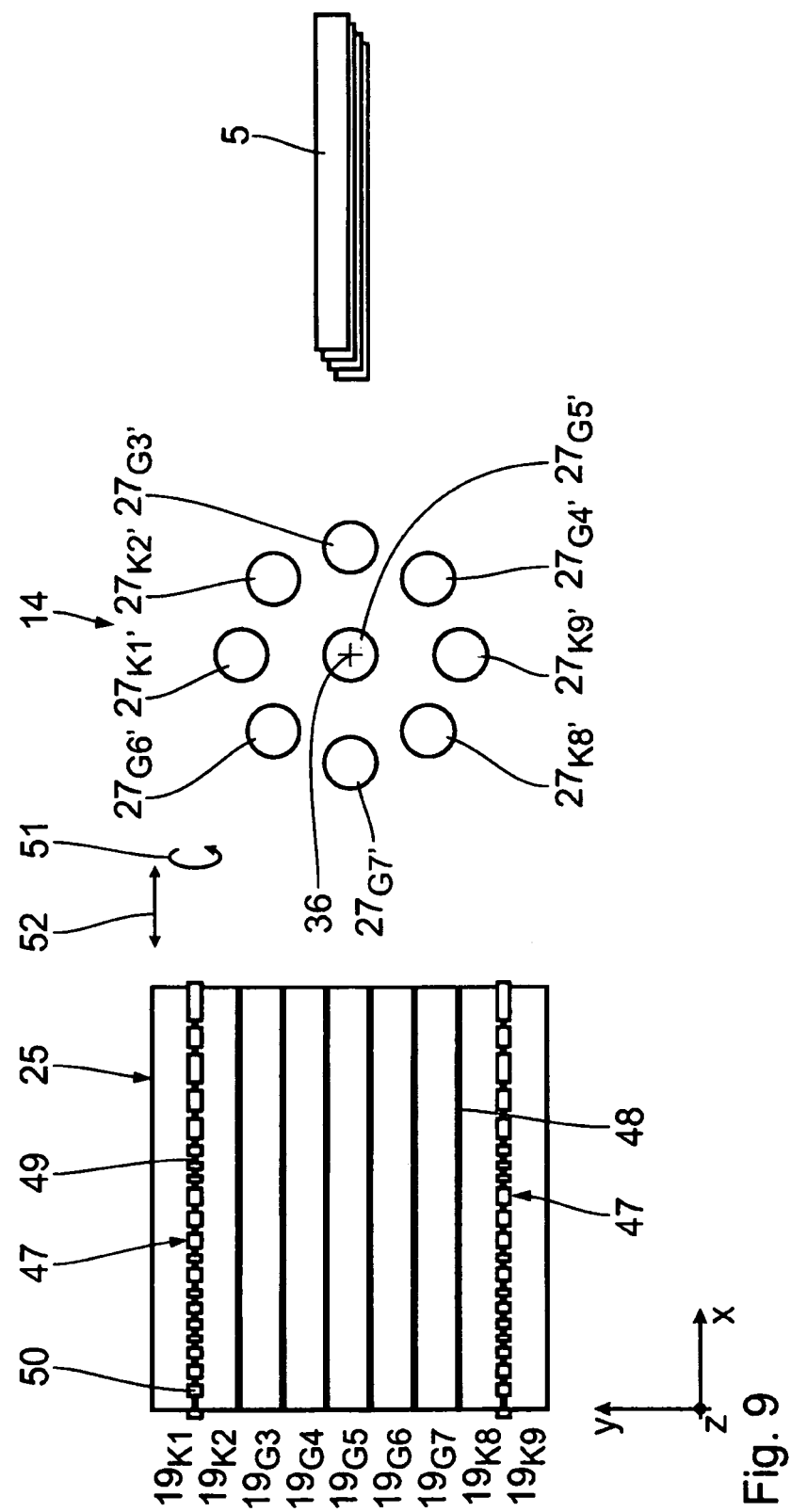
FIG. 9 is a similar view to FIG. 8 of a superposition, with particular field facets being allocated to shading bodies having a base body in the form of a wire and shading portions in the form of thickened areas on the base body, the shading bodies influencing a boundary shape of effectively illuminated areas of these field facets.

FIG. 9 shows a similar view to FIG. 8 of again nine illumination channels, there being provided a total of four correction illumination field facets, namely the field facets $19_{K1}$, $19_{K2}$, $19_{K8}$, $19_{K9}$, and five basic illumination field facets, namely the field facets $19_{G3}$ to $19_{G7}$ with associated correction illumination pupil facets $27_{K1'}$, $27_{K2'}$, $27_{K8'}$, $27_{K9'}$, and basic illumination pupil facets $27_{G3'}$ and $27_{G7'}$.

The correction illumination field facets $19_{K1}$, $19_{K2}$ and $19_{K8}$, $19_{K9}$ are in each case shaded by a shading body 47 at the location where they are adjacent to each other. The shading bodies 47 are arranged at a distance from a reflection plane which is defined by the reflective surface of the field facet mirror 13. The shading bodies 47 are in each case arranged above a gap 48 between the two adjacent correction illumination field facets $19_{K1}/19_{K2}$ and $19_{K8}/19_{K9}$. The shading bodies 47 have a base body 49 in the form of a wire which extends along the gap 48. The width of the base body 49 is smaller than the width of the gap 48 in the y-direction. Along the base body 49, shading portions 50 of the shading body 47 are arranged on the base body 49, the width of the shading portions 49 being greater in the y-direction than the width of the gap 48 between the two adjacent correction illumination field facets $19_K$. The shading portions 50 are lined up on the wire base body 49 like pearls on a string. The shading portions 50 can also be understood as thickness variations of the base body 49 in the y-dimension. The width of the shading portions 50 in the y-direction and their frequency of occurrence along the base body 49 in the x-direction results in a corresponding variation in the x-direction of the surface of the correction illumination field facets $19_{K1}/19_{K2}$ and $19_{K8}/19_{K9}$ reflecting the EUV radiation 10. For correcting an illumination intensity variation I(x), for instance according to FIG. 7, the shading portions 50 may be distributed in such a way that the frequency of occurrence of the shading portions 50 decreases from the left to the right of FIG. 9. As long as the shading variation generated thereby in the x-direction exceeds the illumination variation on the correction illumination field facets $19_K$, the correction illumination field facets $19_K$ provide an increasing illumination intensity contribution from the left to the right of the object field 5, thus resulting in a compensation contribution to the oppositely directed intensity contribution of the basic illumination field facets $19_G$.

In the arrangement of FIG. 9, the correction illumination pupil facets $27_{K1'}$, $27_{K2'}$, $27_{K8'}$, $27_{K9'}$ are arranged point-symmetrically around the center 36 of the pupil facet mirror 14 as well. As already explained above, this ensures that the telecentricity and optionally the ellipticity are maintained when the correction illumination field facets $19_K$ are in use.

Instead of a wire, the base body 49 may also be equipped with a film strip or a tape. The shading portions 50 may be designed such that they are formed by removing material from the edges of the base body 49, for instance by eroding. In an alternative embodiment, the shading portions 50 are designed such that the edges of the in particular tape-shaped base body 49 are cut to the desired shape.

Figure 10:
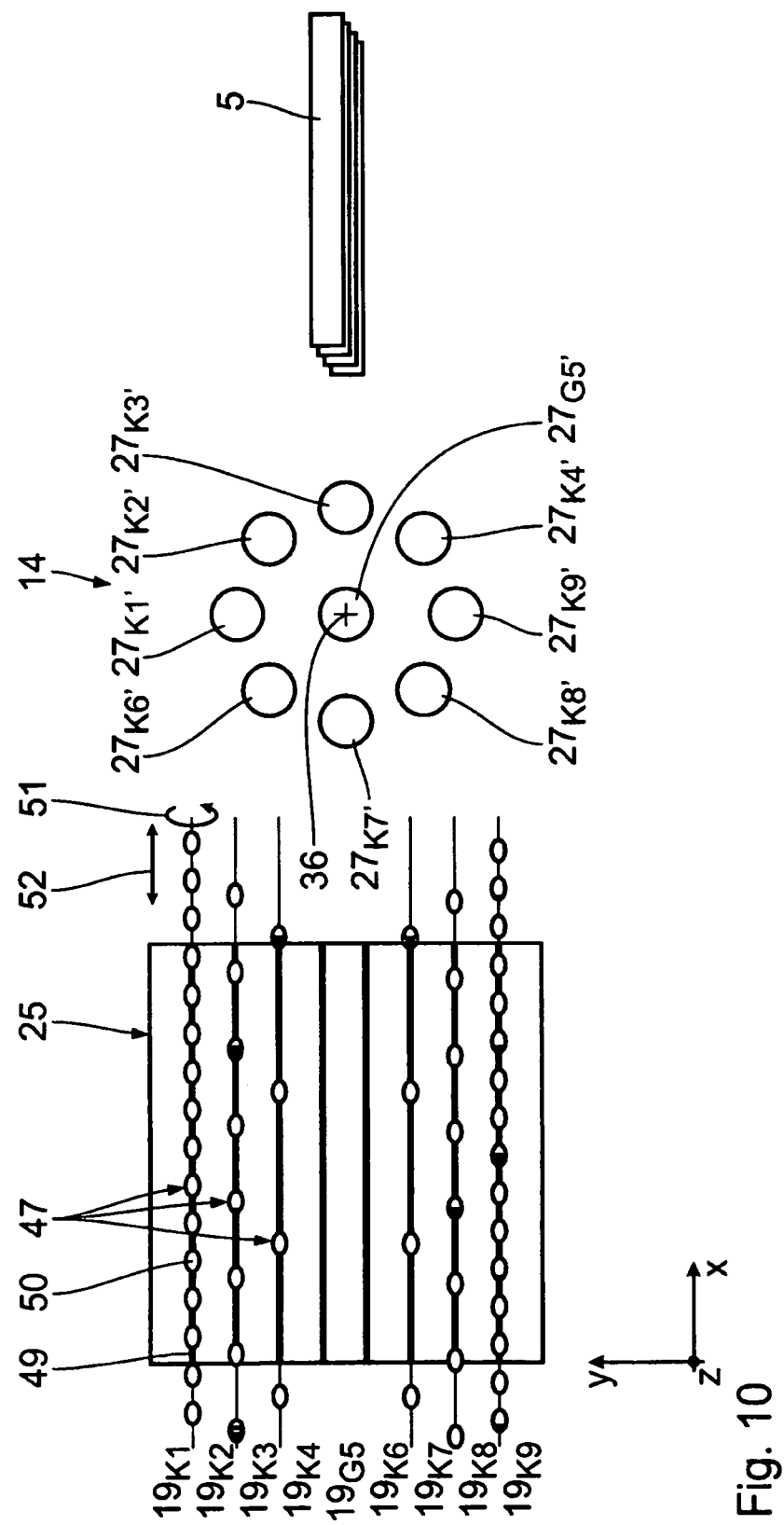
FIG. 10 is a similar view to FIG. 8 of another embodiment of differently designed pairs of shading bodies for influencing the boundary shape of effectively illuminated areas of the field facets.

In certain correction illumination field facets $19_K$, the shading portions 50 may be spaced from each other by a constant spatial frequency or period. A corresponding embodiment is shown in FIG. 10. In this embodiment, a wire-shaped base body 49 with pearl- or disc-shaped shading portions 50 is arranged between the correction illumination field facets $19_{K1}$ and $19_{K2}$ and between the correction illumination field facets $19_{K8}$ and $19_{K9}$, the shading portions 50 repeating themselves regularly along the x-dimension of the correction illumination field facets $19_{K1}/19_{K2}$ and $19_{K8}/19_{K9}$ for a total of eleven times. Between the correction illumination field facets $19_{K2}$ and $19_{K3}$ and between the correction illumination field facets $19_{K7}$ and $19_{K8}$, shading bodies 47 with wire-shaped base bodies 49 and shading portions 50 are arranged which repeat themselves along the x-dimension of the correction illumination field facets $19_{K2}/19_{K3}$ and $19_{K7}/19_{K8}$ for a total of six times. Between the correction illumination field facets $19_{K3}$ and $19_{K4}$ and between the correction illumination field facets $19_{K6}$ and $19_{K7}$, shading bodies 47 with wire-shaped base bodies 49 and shading portions 50 are arranged which repeat themselves along the x-dimension of the correction illumination field facets $19_{K3}/19_{K4}$ and $19_{K6}/19_{K7}$ for a total of two times.

In the embodiment according to FIG. 10, a basic illumination field facet $19_{G5}$ is arranged between the correction illumination field facets $19_{K4}$ and $19_{K6}$.

A Fourier synthesis of an edge absorption of the correction illumination field facets $19_{K1}$ to $19_{K4}$ and $19_{K6}$ to $19_{K9}$ with a variable choice of a set of respective basis functions is possible by arranging the shading bodies 47 according to FIG. 10 as wire stops in such a way that the shading portions 50 are arranged in a sequence with different periods. This Fourier synthesis allows the illumination correction to be fine-tuned via the spatial frequencies, i.e. the distances between the shading portions 50 along the base body 49, via the phases, i.e. the respective x-offsets of for instance the first shading portion 50 on the left of FIG. 10 impinging upon the correction illumination field facets $19_K$, and via the amplitude, i.e. the y-dimension of the respective shading portions 50. The x-offset, i.e. the x-position of the shading portions 50 of the shading bodies 47, may be defined by displacing the shading bodies 47 in the x-direction, as indicated in FIG. 10 by a direction arrow 52.

In the embodiment according to FIG. 10, the correction illumination field facets $27_{K'}$, which are shaded by similar shading bodies 47, are point-symmetric relative to the center 36 of the pupil facet mirror 14 as well to ensure that a telecentricity and optionally also an ellipticity are maintained. In the embodiments according to FIGS. 9 and 10, the correction illumination field facets $19_{K'}$, which are shaded by similar shading bodies 47, are furthermore mirror-symmetric relative to a central xz-plane of the field facet block 25.

If the shading portions 50 are disc-shaped, a shading-effective y-dimension of the shading portions 50 is variable by rotating the shading body 47 about the longitudinal axis of the base body 49, as indicated in FIG. 10 by a direction arrow 51.

In the embodiment according to FIG. 10, the shading portions 50 may be designed such as to achieve a sinusoidal thickness variation of the shading body 47. Likewise, there may be provided several base bodies 49 of this type including shading portions 50 with sinusoidal thickness variations which are placed on top of one another. The corrective effect of the shading portions of these base bodies may be fine tuned by displacing these two base bodies 49 lying on top of one another relative to each other in the longitudinal direction.

Figure 11:
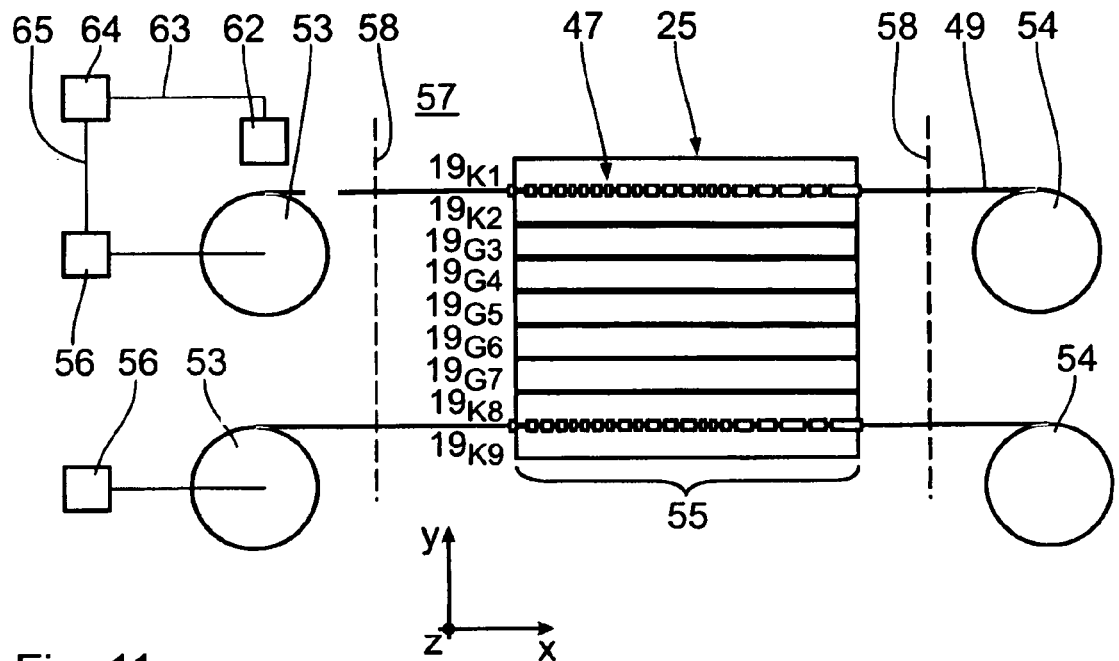
FIG. 11 shows the field facet mirror with the shading bodies according to FIG. 9 together with rolls for winding up the shading bodies.

FIG. 11 shows a possible holding mechanism for the shading bodies 47 above the reflection plane of the field facet block 25.

Both ends of the base body 49 are wound up on in each case one roll 53, 54 and are windable and unwindable from these rolls 53, 54. A shading region 55 of the shading bodies 47, which is used for shading and whose x-extension corresponds to the x-extension of the correction illumination field facets $19_K$, is guided between the two rolls 53, 54. The rolls 53, which are shown on the left of FIG. 11, are in each case provided with a drive 56 for winding and unwinding the base body 49. The rolls 53, 54 and the drives 56 may be arranged outside an evacuated space 57 in which the remaining illumination system 2 is arranged. Lock planes 58 for the evacuated space 57 are shown dashed in FIG. 11.

Figure 12:
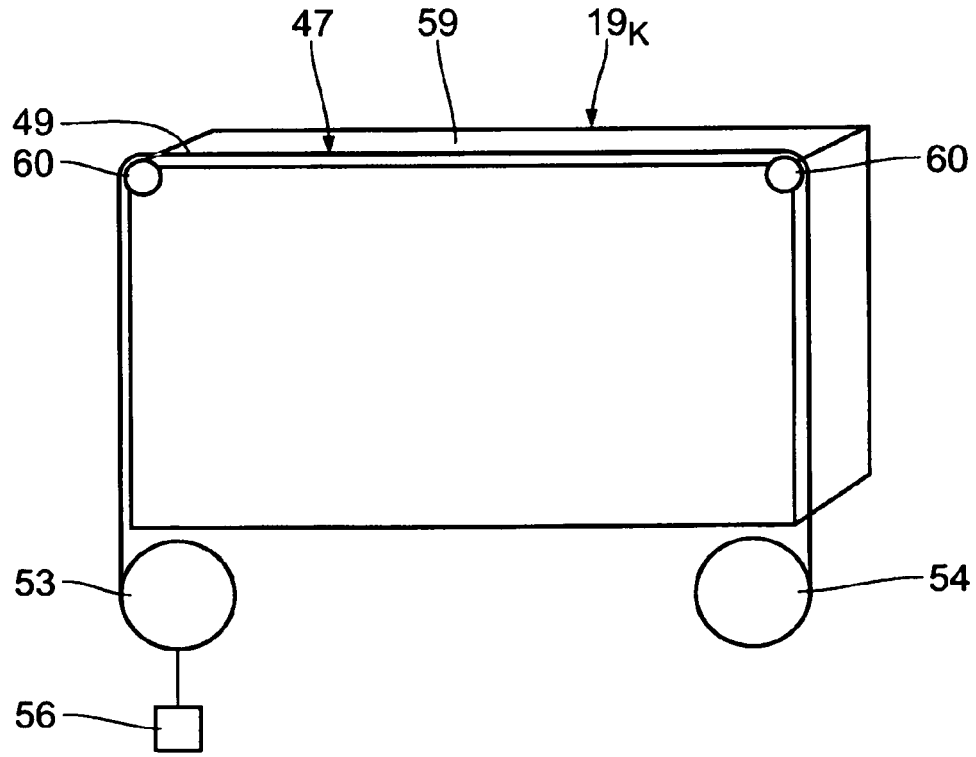
FIG. 12 is a perspective view of an individual field facet together with a shading body having a base body in the form of a wire and shading portions, with the shading body being guided over and wound on rolls.

FIG. 12 shows an alternative embodiment of a holding mechanism for a shading body 47 in the manner of the shading bodies 47 according to FIGS. 9 and 10 near a single correction illumination field facet $19_K$. The base body 49 of the shading body 47 is guided and supported above a reflective surface 59 of the correction illumination field facet $19_K$ via two guide rolls 60. Via the guide rolls 60, one end of the base body 49 is guided to the roll 53 while the other end of the base body 49 is guided to the roll 54. The two rolls 53, 54 are arranged on the side of the correction illumination field facet $19_K$ remote from the reflective surface 59.

Figure 13:
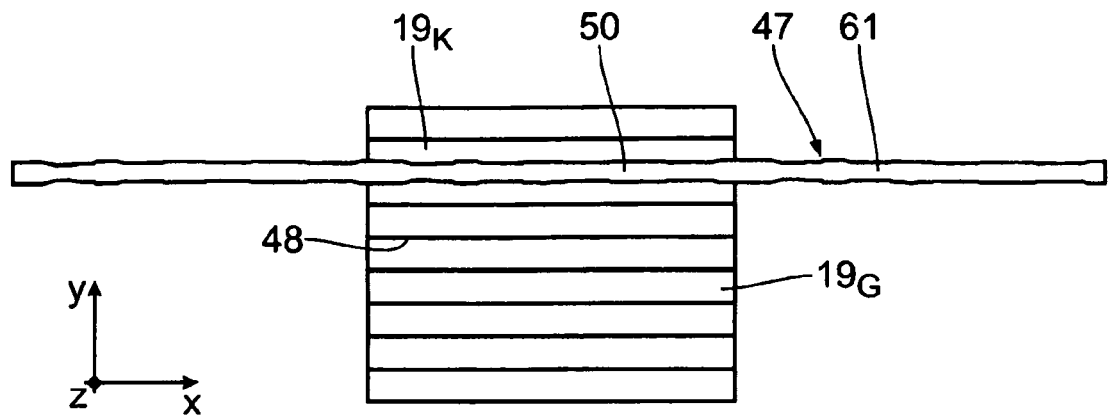
FIG. 13 is a plan view of a field facet mirror including another embodiment of a shading body arranged between two field facets for influencing a boundary shape of effectively illuminated areas of particular field facets.

FIG. 13 is a similar view to the illustration on the left of FIG. 9 of a shading body 47 with a base body in the form of a tape 61. In order to form the shading portion 50, a width of the tape 61, in other words the y-dimension thereof, is cut to the appropriate size to achieve the desired intensity correction; the shading portion 50 may for instance also be formed by eroding. According to the illustration of the shading body 47 in FIG. 3, the width of the tape 61 exceeds the entire width of the gap 48 between the associated correction illumination field facets $19_K$. In certain regions, the width of the tape 61 may also correspond to the width of the gap 48 or may even be smaller than the gap 48 to prevent the correction illumination field facets $19_K$ from being shaded in these regions by the shading body 47 according to FIG. 13. Corresponding to the wire base body 49, the tape 61 may be wound on rolls 53, 54 as explained above with reference to the embodiment according to FIGS. 11 and 12.

When preparing the projection exposure apparatus 1 for operation, the form of the shading portions 50 of the shading bodies 47 of the embodiments described above may be selected via a forming device, for instance on the basis of a calibration measurement of an illumination of the object field 5. The forming device may for instance be a cutting device or an eroding device.

Along the base body 49, there may be provided several successive shading regions 55 with various sequences of shading portions 50 which are selected depending on the desired properties for the correction of the object field illumination via the correction illumination field facets $19_K$. For instance, a sequence of shading regions 55 may be provided which includes shading portions 50 that are equidistantly arranged in succession; in each of the succeeding shading regions 55, the spatial frequency of the succeeding shading portions 55 changes for instance depending on the different spatial frequencies of the embodiment according to FIG. 10. The succeeding shading regions may for instance be identified by marks which are applied to the base body 49. These marks are optically detectable by a reading device 62 (cf. FIG. 11) which is in signal connection with a control device 64 via a signal line 63. The control device 64 is in turn in signal connection with the drive 56 of the roll 53 via a signal line 65.

The reading device 62 and the control system connected thereto are shown in FIG. 11 by the example of the winding and unwinding device illustrated therein.

If an intensity variation is measured during a calibration measurement of the object field illumination which involves the use of correction illumination field facets $19_K$ together with particular shading bodies 47, then the drive 56 of the associated roll 53 is actuated until the reading device 62 has detected the mark which is allocated to the shading region 55 with the shading portion 50. The desired shading region 55 is in each case approached in a controlled manner via the control device 64.

Figure 14:
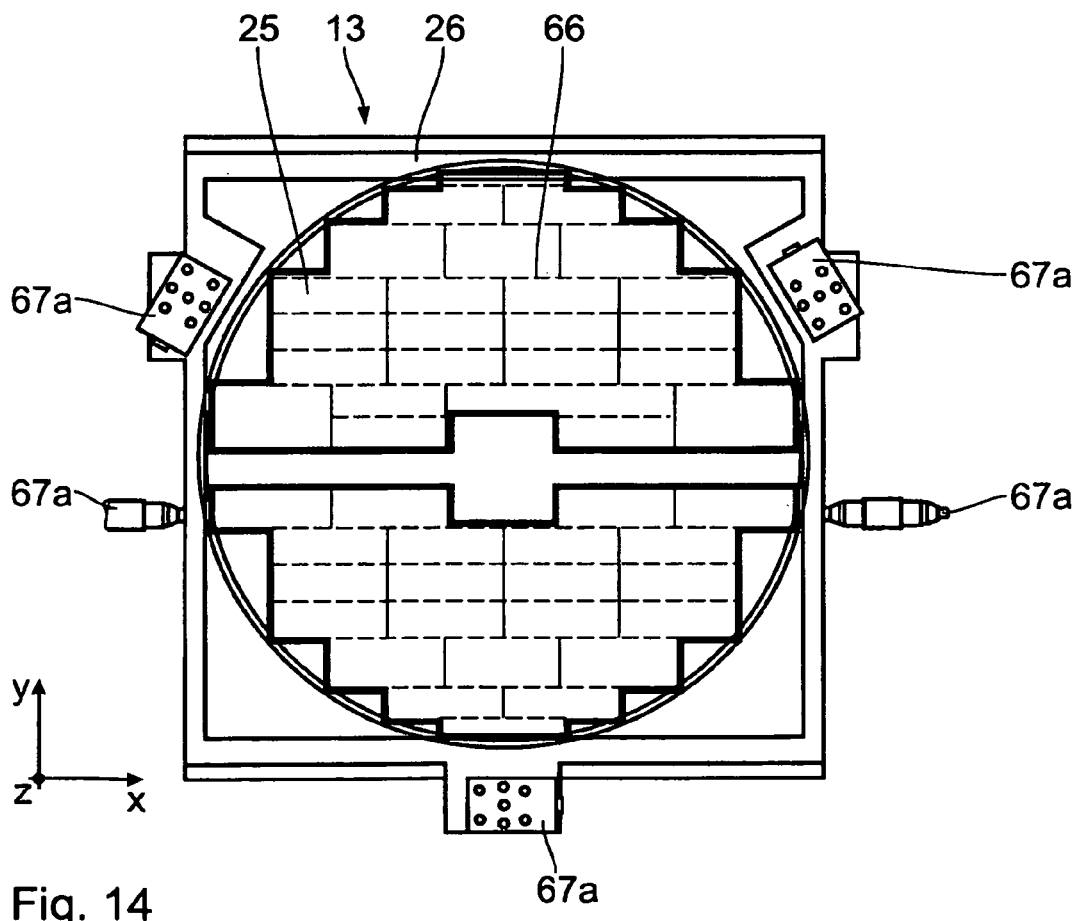
FIG. 14 is a plan view of another embodiment of a field facet mirror shown with additional details, the field facet mirror including another embodiment of shading bodies with insertion portions inserted between two field facets.
Figure 15:
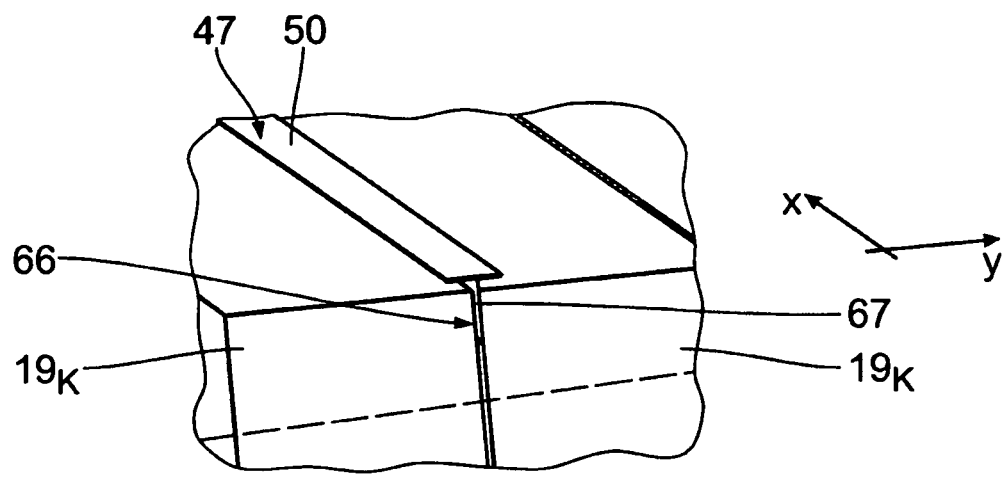
FIG. 15 is a perspective sectional view of the field facet mirror according to FIG. 14 including two field facets and a shading body arranged therebetween.
Figure 16:
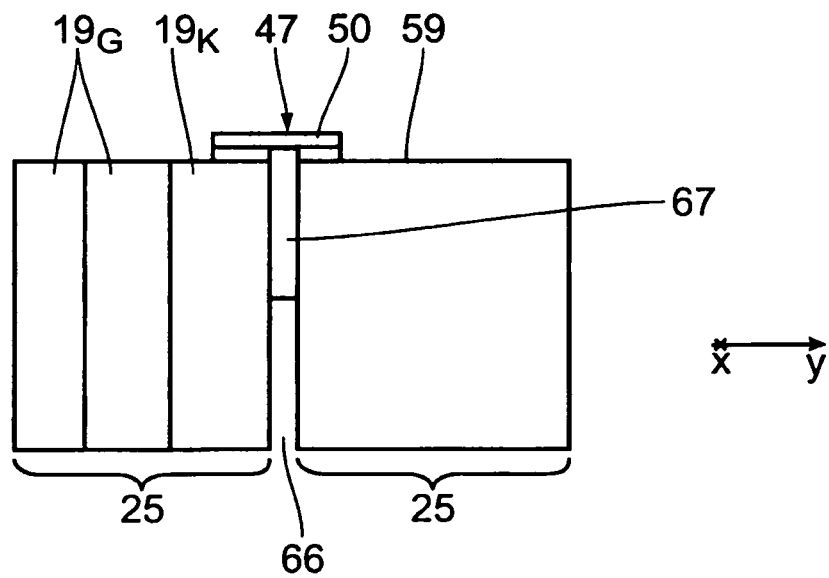
FIG. 16 is a side view of two blocks of field facets of the field facet mirror according to FIG. 14, with a shading body with an insertion portion being arranged between the two field facet blocks.

The following is a description, via FIGS. 14 to 16, of another embodiment of a field facet mirror 13 with shading bodies 47 for generating correction illumination field facets 19. Components and functions which correspond to those that have already been explained above with reference to FIGS. 1 to 13 have the same reference numerals and are not discussed in detail again.

The field facet mirror 13 according to FIG. 14 is divided into a plurality of field facet blocks 25 which in turn include a plurality of field facets 19, similar to the field facet blocks 25 of the embodiment according to FIG. 2. Between the field facet blocks 25 are provided gaps 66 with a width of 0.5 mm. FIG. 14 further shows adjustment elements 67a for adjusting the field facet mirror 13 in a total of five degrees of freedom.

In the embodiment according to FIGS. 14 to 16, the shading body 47 has an insertion portion 67 which is inserted into the gap 66 between two adjacent correction illumination facets $19_K$. The shading portion 50 of the shading body 47 according to FIGS. 14 to 16 is rigidly connected to the insertion portion 67 extending along the gap 66 in the x-direction. The insertion portion 67 can be formed in one piece with the shading portion 50. Alternatively, as indicated in FIG. 16, the shading portion 50 may be fabricated as a component which is at first separate from the insertion portion 67 and is then joined to the insertion portion 67.

The shading portion 50 and the insertion portion 67 of the shading body 47 may be made of molybdenum.

A boundary of the shading portion 50, which extends along the x-direction and projects beyond the reflective surfaces 59 of the associated correction illumination field facets $19_K$, may for instance be formed similar to the boundary of the tape shading body 47 according to FIG. 13.

Figure 17:
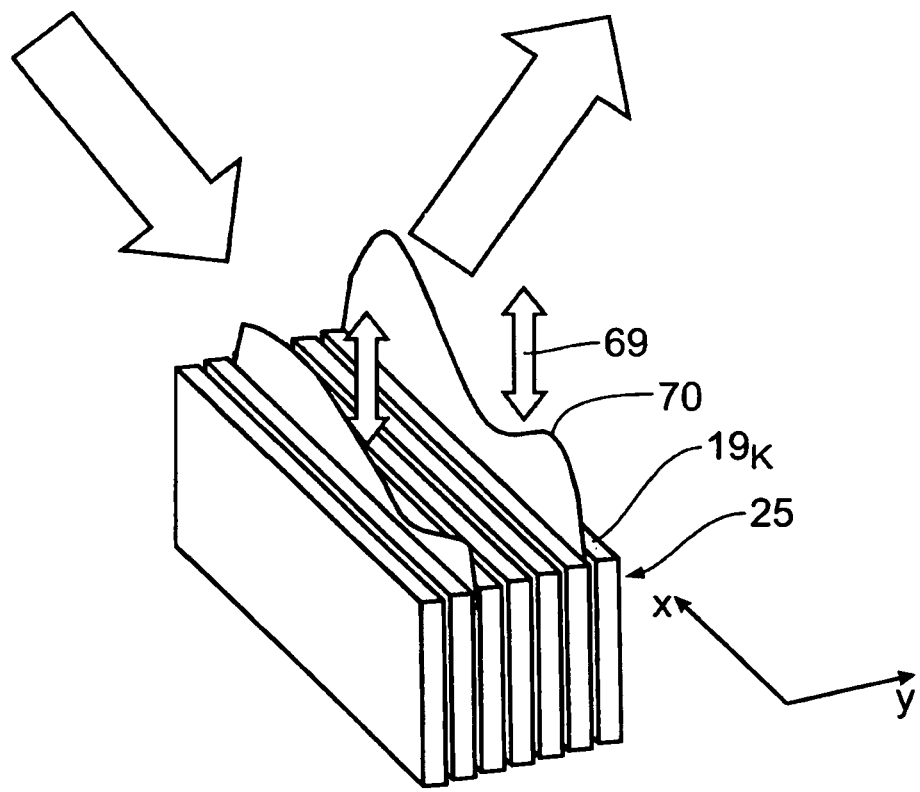
FIG. 17 shows seven adjacent field facets of the field facet mirror according to FIG. 14 with two shading bodies of another embodiment of a shading body, the shading bodies also including an insertion portion which is inserted between in each case two facets of the field facet mirror.
Figure 18:
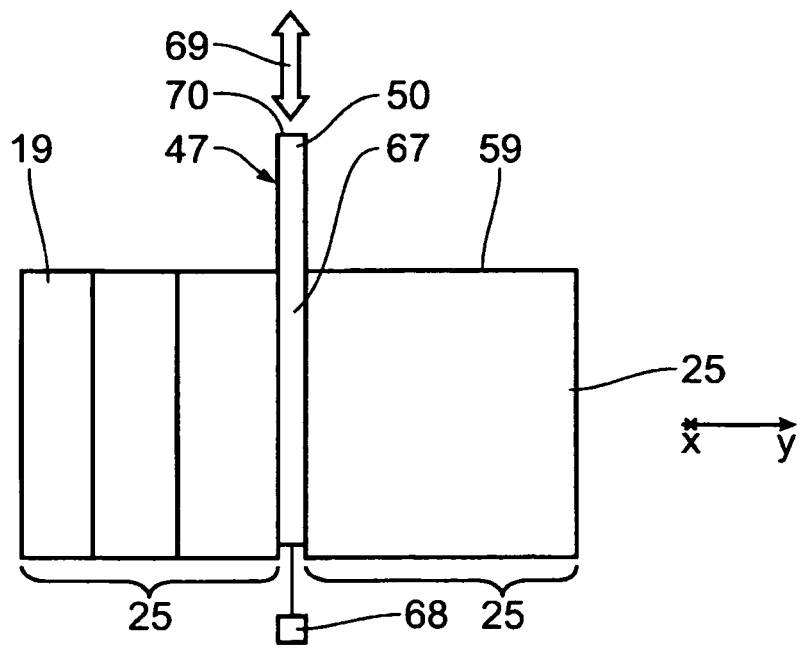
FIG. 18 is a similar view to FIG. 16 of the embodiment including a shading body of the type according to FIG. 17, the shading body being arranged between two blocks of field facets.

The following is a description of another embodiment of a shading body 47 via FIGS. 17 and 18. FIG. 17 shows an embodiment where the shading bodies 47 are inserted between adjacent field facets 19 in a field facet block 25. FIG. 18 shows an embodiment where a shading body 47 is inserted between adjacent field facet blocks 25. The shading body 47 according to FIGS. 17 and 18 has a shading portion 50 which forms an extension of the insertion portion 67 projecting beyond the reflective surface 59 of the field facets 19. An actuator 68, which is diagrammatically shown in FIG. 18, allows the shading body 47 to be displaced perpendicular to the reflective surface 59, as indicated in FIG. 18 by a direction arrow 69. For variable shading of the correction illumination field facets $19_K$, a free edge 70 of the shading portion 50 is formed corresponding to a function depending on the x-position thereof when seen along the x-direction, as shown by the diagrammatic and exaggerated illustration of FIG. 17.

Figure 19:
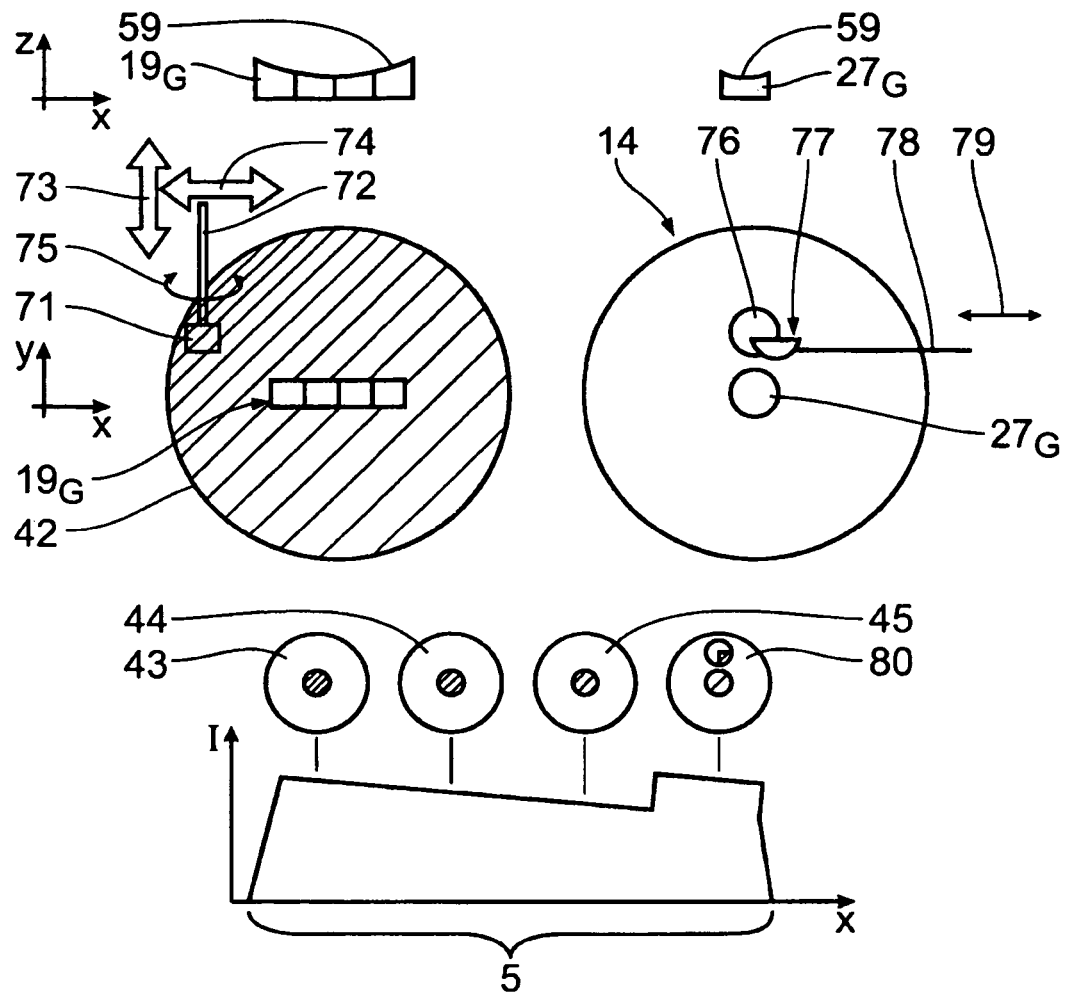
FIG. 19 is a similar view of FIG. 7 of an arrangement including correction illumination field facets which have a surface area that makes up a partial surface area of a basic illumination field facet of the field facet mirror.

The following is a description of further embodiments of correction illumination field facets via FIG. 19. Components and functions which correspond to those that have already been described above with reference to FIGS. 1 to 18 have the same reference numerals and are not discussed in detail again.

FIG. 19 is a similar view to FIG. 7 of a single basic illumination channel with a single basic illumination field facet $19_G$ and a basic illumination pupil facet $27_G$ allocated to the basic illumination field facet $19_G$ via a basic illumination channel. At the top of FIG. 19, these two basic illumination facets $19_G$, $27_G$ are in each case shown in an xz-sectional view which reveals the concave spherical shape of the reflective surfaces 59 of these basic illumination facets $19_G$, $27_G$. FIG. 19 furthermore shows a correction illumination field facet 71. The correction illumination field facet 71 is a mirror portion which is rectangular and has the size of a partial surface area of the basic illumination field facet $19_G$. The correction illumination field facet 71 has the same extension in the y-direction as the basic illumination field facet $19_G$. In the x-dimension, the extension of the correction illumination field facet 71 amounts to one quarter of the extension of the basic illumination field facet $19_G$. In the example of FIG. 19, the mirror surface of the correction illumination field facet 71 therefore amounts to one quarter of the basic illumination field facet $19_G$. The correction illumination field facet 71 is held in place by a thin, vacuum-compatible bar 72 which extends in the y-direction and has a negligible width in the x-direction compared to the width of the basic illumination field facet $19_G$. The bar 72 is displaceable in the y-direction (cf. direction arrow 73) and in the x-direction (cf. direction arrow 74) and is pivotable about its longitudinal axis (cf. direction arrow 75) by correspondingly manipulating the bar 72 via drives (not shown). This allows one to change the position of the correction illumination field facet 71 on the illumination area 42 on the one hand and a deflection angle of the correction illumination field facet 71 for the EUV radiation 10 on the other.

A correction illumination pupil facet 76 is allocated to the correction illumination facet 71 via a correction illumination channel. This correction illumination channel is adjusted via the tilt angles of the correction illumination facets 71, 76 in such a way that it illuminates a quarter of the object field 5 shown at the bottom right of FIG. 19. The correction illumination pupil facet 76 is in close proximity to the basic illumination pupil facet $27_G$ on the pupil facet mirror 14.

The correction illumination pupil facet 76 may be partially covered by a variable shading stop 77. The shading stop 77 is held in place by a bar 78 which extends in the x-direction and is displaceable in the x-direction (direction arrow 79) via a drive (not shown). The course of the bar 78 of the shading stop 77 is such that no other pupil facet is shaded by the bar 78.

A stop body of the shading stop 77 has the shape of a semicircle which covers a lower half of the correction illumination pupil facet 76 when the shading stop 77 is fully inserted. In the position shown in FIG. 19, the shading stop 77 shades approximately a quarter at the bottom right of the correction illumination field facet 76. The shading stop 77 allows an illumination intensity on the correction illumination channel to be fine-tuned.

The intensity diagram I(x) at the bottom of FIG. 19, which corresponds to the I(x) diagram according to FIG. 7, illustrates the effect of the correction illumination facets 71, 76. In the embodiment according to FIG. 19, the three quarters on the left of the object field 5 when seen in the x-direction see the same illumination as in the embodiment according to FIG. 7. The quarter of the object field 5 which is farthest to the right when seen in the x-direction provides an illumination angle distribution which is composed of the illumination from the basic illumination pupil facet $27_G$ and of the illumination from the correction illumination pupil facet 76.

As a result, the quarter of the object field 5 at the bottom right of FIG. 19 sees an illumination intensity which approximately corresponds to an average value of the illumination intensities of the remaining three quarters of the object field 5, the illumination arriving in each case from the direction of the closely adjacent pupil facets $27_G$ and 76. The correction illumination channel including the correction illumination field facet 71 and the correction illumination pupil facet 76 therefore provides for a compensation of the illumination intensity provided in the bottom right quarter of the object field 5 via the basic illumination channel; if no correction was provided, the illumination intensity would decrease.

Other ratios of the surface areas of the basic illumination field facet $19_G$ on the one hand and the correction illumination field facet 71 on the other between 1:100 and 1:1 are conceivable. This ensures a particularly fine correction of the illumination intensity distribution I(x).

Figure 20:
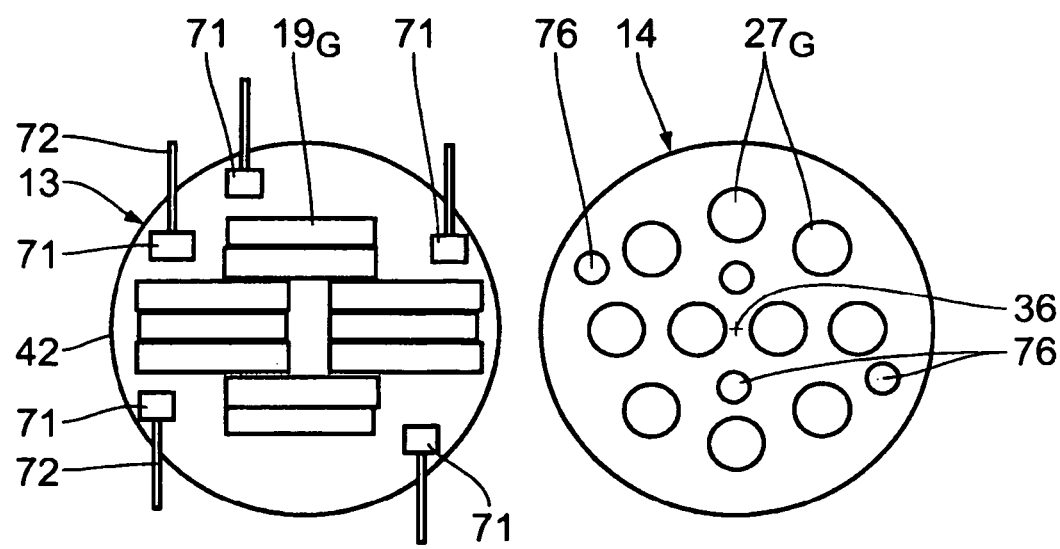
FIG. 20 is a similar view to FIG. 2 of an application example of the correction illumination field facets according to FIG. 19 with associated correction illumination pupil facets.

FIG. 20 shows an exemplary arrangement of several correction illumination field facets 71 with associated correction illumination pupil facets 76 in a field facet mirror 13 which is in this example equipped with ten basic illumination field facets $19_G$. The correction illumination field facets 71 are arranged at the edge of an illumination area 42 of the EUV radiation 10 which is not used for the illumination of the basic illumination field facets $19_G$. The embodiment according to FIG. 20 includes a total of ten basic illumination channels and six correction illumination channels. The correction illumination pupil facets 76 are in turn arranged in pairs which are point symmetric relative to the center 36 of the pupil facet mirror 14.

The following is a description, via FIGS. 21 to 31, of an illumination compensation by shifting source images relative to pupil facets on the one hand and by shifting illumination channels on the object field on the other.

Figure 21:
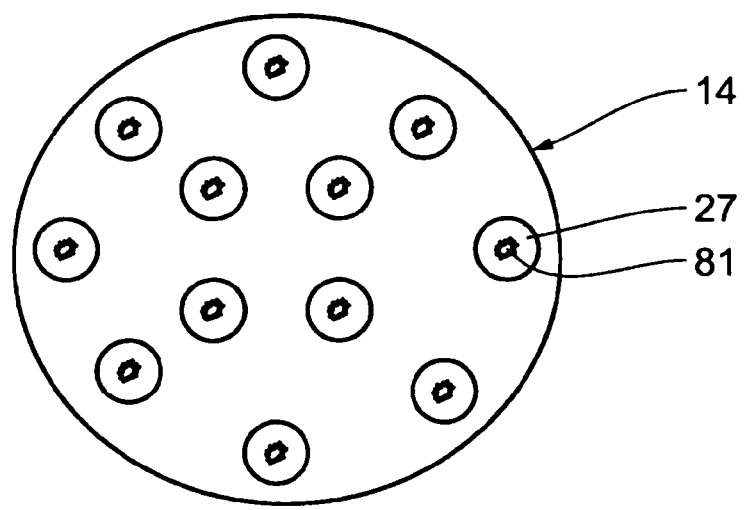
FIG. 21 is a diagrammatic plan view of a pupil facet mirror, with source images of a radiation source of the projection exposure apparatus being disposed on the pupil facets thereof.

FIG. 21 shows an exemplary pupil facet mirror 14 including twelve pupil facets 27, with source images 81 of the radiation source 3 being in each case arranged centrally thereon.

Figure 22:
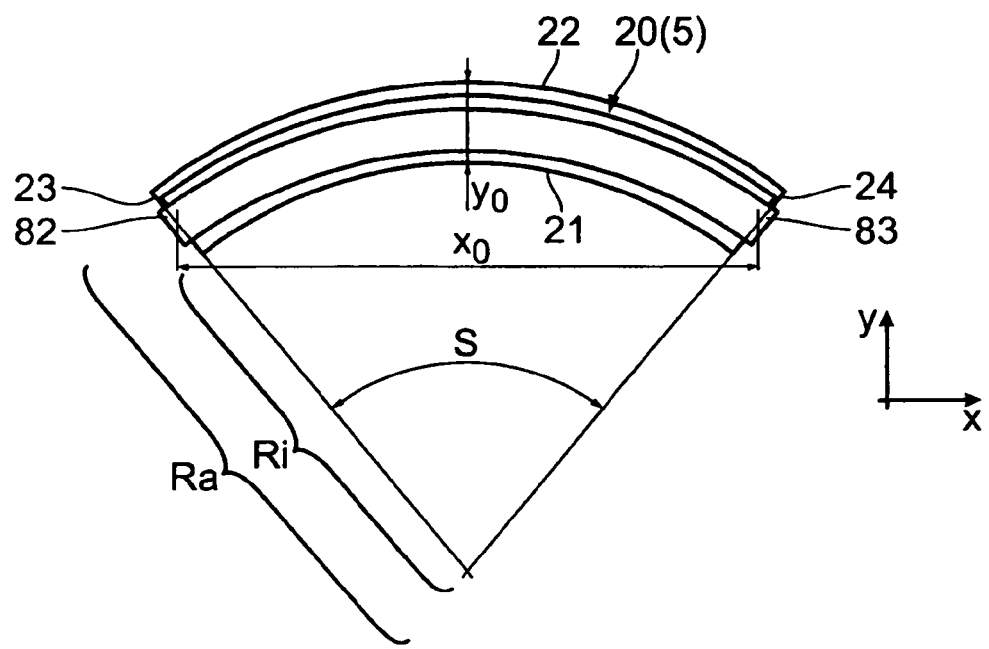
FIG. 22 is a diagrammatic view of a reticle portion corresponding to the object field with two illumination channels which are superimposed on the reticle portion and overlap each other in certain regions.

FIG. 22 shows the portion of the reticle 20 which is present at the location of the equally contoured object field 5, in other words which is currently exposed to radiation. This portion of the reticle 20 has two field facet images 82, 83 which are superimposed thereon. The two field facet images 82, 83 are allocated to corresponding illumination channels. The field facet image 82 illuminates the reticle 20 across the entire sector angle S. The radial extension of the field facet images 82 across the entire sector angle S is smaller than the associated radial extension $y_0$ of the reticle 20 so that above and below the field facet image 82 of FIG. 22, there are strips of the reticle 20 which are not covered by the field facet image 82. The field facet image 83 covers a sector angle S which protrudes on both sides beyond the sector angle S which is covered by the reticle 20. The radial extension of the field facet image 83 corresponds to that of the field facet image 82. FIG. 22 shows that the type of arrangement and superposition of the various field facet images 82, 83, which are allocated to the illumination channels, is decisive for the illumination intensity distribution and the illumination angle distribution across the object field 5 corresponding to the reticle 20. A defined deviation of the field facet images 82, 83 from a perfect superposition with the object field 5 may be used to compensate for or to correct unwanted variations of illumination parameters across the object field 5.

Figure 23:
FIG. 23 shows an individual pupil facet with a source image impinging upon the edge thereof.

FIG. 23 shows the case where one of the source images 81 is not entirely reflected by the associated pupil facet 27 but is cut off at the edges in a defined manner. Accordingly, the illumination direction, which is allocated to the pupil facet 27, only contributes a reduced illumination intensity to the illumination of the object field 5. The source image 81 can be cut off in a defined manner by tilting the correction illumination field facet $19_K$, which is allocated to the correction illumination pupil facet $27_K$ according to FIG. 23, via an actuator.

Figure 24:
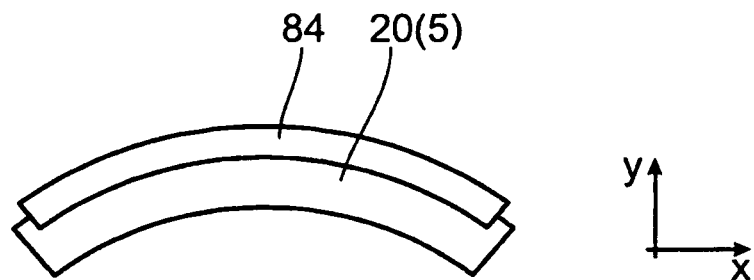
FIG. 24 is a similar view to FIG. 22 of the reticle portion, an illumination channel impinging upon an edge region thereof when seen relative to a reticle scanning direction.

FIG. 24 shows a correction achieved by a defined tilting of a correction illumination pupil facet $27_K$, the tilting being such that an associated field facet image 84 has partially migrated out of the reticle 20 or the object field 5, respectively, in the positive y-direction. The migrated portion may for instance be cut off via a field stop or via a UNICOM stop which is arranged near the reticle 20. Corresponding field stops, which are arrangeable in a field plane of the illumination optics 4, are disclosed in WO 2005/040927 A2, in US 2006/0244941 A1 or in WO 2007/039257 A1.

Figure 25:
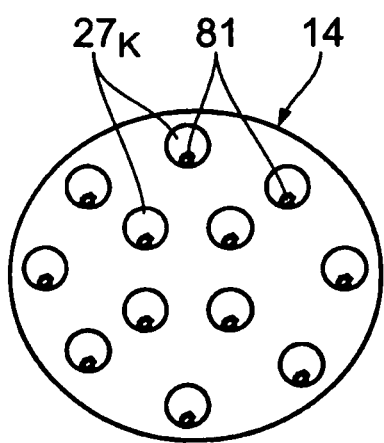
FIG. 25 is a similar view to FIG. 21 of the pupil facet mirror with source images which are in each case displaced towards the edge of the individual pupil facets in the same way.
Figure 26:
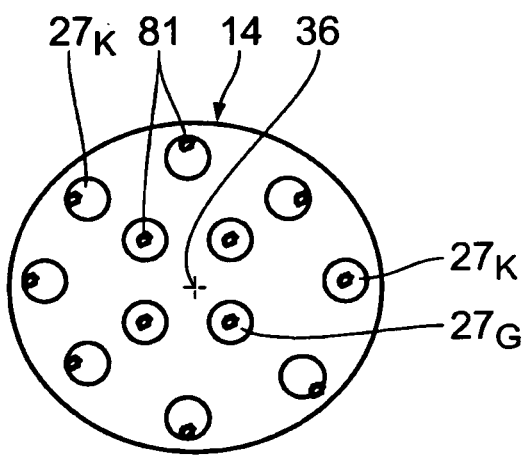
FIG. 26 is a similar view to FIG. 21 of the pupil facet mirror with source images which are individually positioned on the pupil facet mirrors or are cut off at the edges.

FIGS. 25 and 26 show two examples of a displacement of source images 81 relative to correction illumination pupil facets $27_K$. In FIG. 25, all source images 81 have been shifted downwards on the correction illumination pupil facets $27_K$ in order for them to be cut off at the outermost edge of the correction illumination pupil facets $27_K$. Accordingly, the correction illumination channels of these correction illumination pupil facets $27_K$ is exposed to a reduced intensity compared to the illumination channels of the remaining pupil facets 27.

In FIG. 26, the source images 81 have individually been displaced on the correction illumination pupil facets $27_K$ which are arranged at the edge of the pupil facet mirror 14. Some of the source images 81 have been displaced towards the left-hand edge while others have been displaced towards the upper, lower, right-hand or bottom right-hand edge of the correction illumination pupil facets $27_K$ where they are partially cut off. In one of the correction illumination pupil facets $27_K$ shown on the right of FIG. 26, the source image 81 remains in the center 36 of the facet. Four basic illumination pupil facets $27_G$ are arranged next to the center 36 of the pupil facet mirror 14 according to FIG. 26, with the source image 81 being in each case arranged centrally on the basic illumination pupil facets $27_G$ for the source image 81 to be reflected completely. As a result, an illumination correction is achieved on the object field 5 which corresponds to this partially cut-off image according to FIG. 26.

The source images 81 are displaceable on the correction illumination pupil facets $27_K$ by tilting individual correction illumination field facets $19_K$, by tilting the entire field facet carrier 26 or by shifting the radiation source 3.

FIGS. 27 and 28 show how the correction illumination pupil facets $27_K$ shown there may be used for changing a correction illumination setting. In the embodiment according to FIGS. 27 and 28, there is provided one more correction illumination pupil facet $27_K$ than there are correction illumination pupil facets $27_K$ which are exposed to radiation. One of the correction illumination pupil facets $27_K$ is therefore not exposed to radiation. The correction illumination pupil facet $27_K$, which is not exposed to radiation, is shown on the bottom right of FIG. 27.

The illumination of the pupil facet mirror 14 according to FIG. 28 has been modified compared to that according to FIG. 27. In the illumination example according to FIG. 28, a correction illumination field facet $19_{K1}$ (not shown), which is allocated to the correction illumination pupil facet $27_{K1}$ via an illumination channel, has been displaced compared to FIG. 27 in such a way that the correction illumination field facet $19_{K1}$ now illuminates the correction illumination pupil facet $27_{K2}$ which had previously not been exposed to radiation. Accordingly, this also results in a variation of the superimposed angle of the correction illumination. This may for instance be used for correcting the telecentricity of the illumination of the object field 5.

FIG. 29 shows another way of using correction illumination facets. In contrast to the previous illustrations, FIG. 29 shows curved correction illumination field facets $19_K$ which are formed corresponding to the curved object field 5.

A first allocation of the correction illumination field facets $19_{K1}$, $19_{K2}$ to two of the correction illumination pupil facets $27_{K1}$ and $27_{K2}$ is illustrated in FIG. 29 via continuous arrows. Alternatively, the allocation can be such as illustrated in FIG. 29 via dashed arrows.

The correction illumination field facet $19_{K1}$ is allocated to the correction illumination pupil facet $27_{K2}$ while the correction illumination field facet $19_{K2}$ is allocated to the correction illumination pupil facet $27_{K1}$. Each variation of the allocation results in a variation of the correction illumination when the correction illumination field facets $19_{K1}$, $19_{K2}$ are illuminated by the radiation source 3 in different ways. The allocation of the correction illumination field facets $19_K$ to the correction illumination pupil facets $27_K$ can be changed depending on an illumination of the object field 5, which is determined via a calibration measurement, by tilting the correction illumination facets $19_K$, $27_K$ in a corresponding way.

Figure 30:
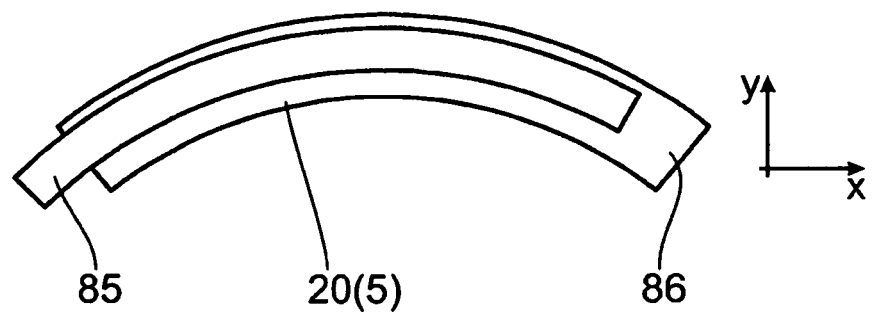
FIG. 30 is a similar view to FIG. 24 of the reticle portion with an illumination channel that is cut off laterally, in other words perpendicular to the reticle scanning direction.

FIG. 30 shows a similar illustration to FIG. 24 of a partial blocking of a field facet image 85 at the field edge on the left of FIG. 30. When the field facet image 85 is tilted relative to the object field 5 and to the reticle 20 about a sector angle in the xy plane, this results in an area 86 of the object field 5 on the right-hand edge according to FIG. 30 which is not exposed to radiation, and on the opposite side thereof, in a portion of the field facet image 85 which is for instance blocked by a field stop and does therefore not impinge upon the object field 5. The area 86, which is not exposed to radiation, therefore sees no light from the direction of the correction illumination pupil facet $27_K$ which guides the illumination channel leading to the field facet image 85. This shading according to FIG. 30 can therefore also be used for correcting an illumination angle distribution across the object field 5.

Figure 31:
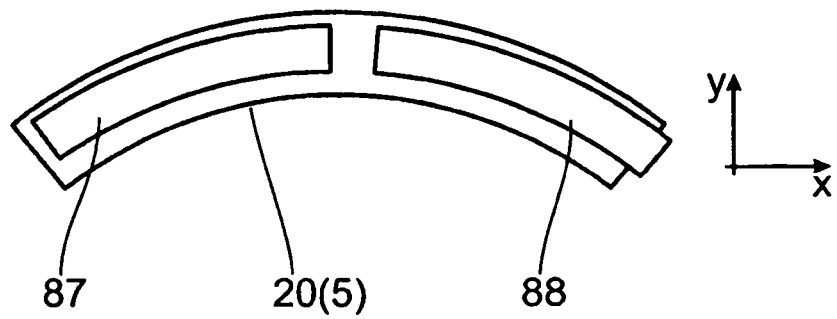
FIG. 31 is a similar view to FIG. 24 of an illumination of the reticle portion via two partial illumination channels of which one is cut off laterally.

FIG. 31 shows the possibility of displacing partial field facet images 87, 88, which may for instance be generated by the correction illumination field facets 71 according to FIGS. 19 and 20, on the object field 5 or on the reticle 20, respectively, by tilting the associated correction illumination pupil facets $27_K$ and to cut them off at the edges if desired (cf. partial field facet image 88). This allows the correction of the object field illumination to be fine-tuned.

Figure 32:
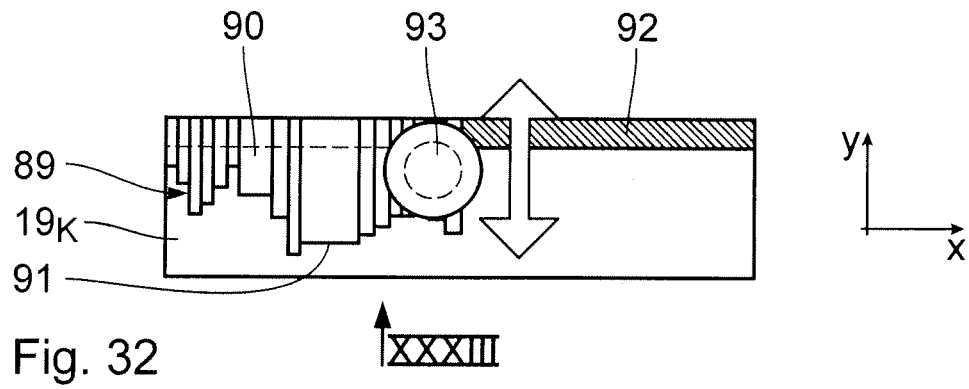
FIG. 32 is a diagrammatic plan view of a field facet of a field facet mirror similar to that according to FIG. 2 with an alternative embodiment of a stop structure for shading the correction illumination field facet.
Figure 33:
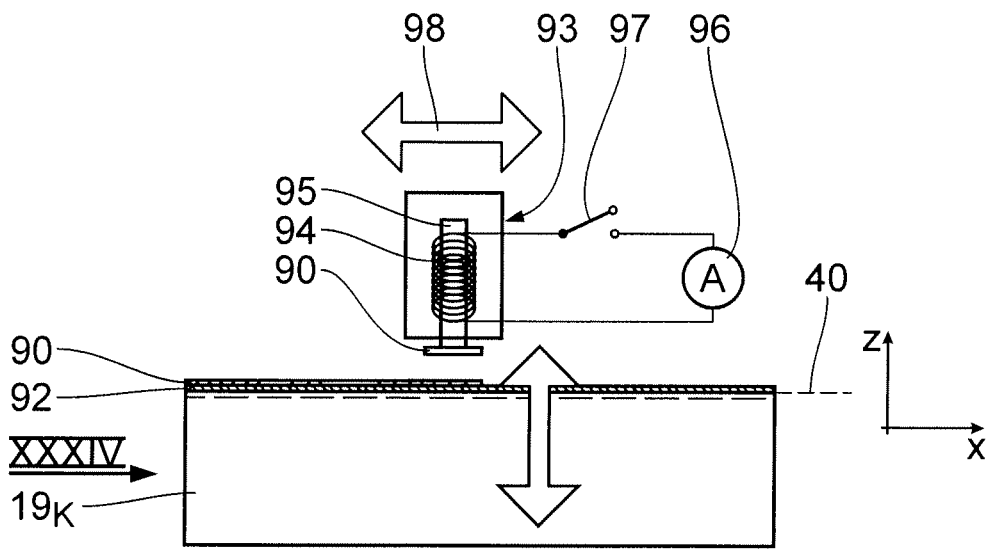
FIG. 33 is a side view of the correction illumination field facet according to FIG. 32 from direction XXXIII in FIG. 32, with an attachment device for individual stops of the stop structure of the correction illumination field facet being additionally shown in a more detailed diagrammatic view.
Figure 34:
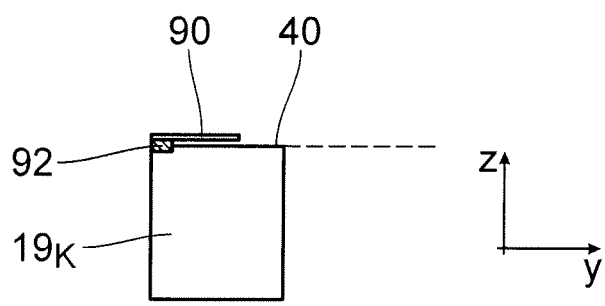
FIG. 34 is a side view of the correction illumination field facets according to direction XXXIV in FIG. 33.

The following is a description, via FIGS. 32 to 34, of another correction illumination variant by shading a correction illumination field facet $19_K$. Components which correspond to those that have already been explained above with reference to FIGS. 1 to 31 have the same reference numerals and are not discussed in detail again.

In the embodiment according to FIGS. 32 to 34, a shading body is formed by a stop structure 89. The stop structure 89 includes a plurality of separate stops 90. In the plan view of the reflective surface of the correction illumination field facet $19_K$ according to FIG. 32, the various separate stops 90 are rectangular in shape and show different extensions in the scanning direction on the one hand, in other words in the y-direction, and perpendicular to the scanning direction on the other, in other words in the x-direction. These various extensions of the separate stops 90 in the x- and in the y-direction result in an individual profile shape of a stop edge 91 of the stop structure 89, the stop edge 91 projecting into the reflective surface of the correction illumination field facet $19_K$. Corresponding to this profile shape of the stop edge 91, this results in a correction of the intensity distribution of the illumination light across the correction illumination field facet perpendicular to the scanning direction, in other words in the x-direction. For each correction illumination field facet $19_K$, there may for instance be provided 2, 3, 5, 10, 20, 30 or even more separate stops 90. The separate stops 90 then have a correspondingly small extension. The separate stops 90 abut each other in the x-direction virtually without any gaps therebetween. The separate stops 90 may also overlap in the x-direction, or there may also be a small gap between the separate stops 90 in the x-direction.

A thickness of the separate stops 90 perpendicular to the reflective surface of the correction illumination field facet $19_K$, in other words in the z-direction, is no greater than 0.3 mm; in the illustrated embodiment, the thickness amounts to 0.2 mm.

The separate stops 90 are made of a magnetizable material or have a magnetizable coating. On their ends opposite to the stop edge 91, the separate stops 90 are held in place on a magnetic strip 92 by magnetic forces.

The magnetic strip 92 is attached to the edge of the correction illumination field facet $19_K$ along the x-direction. In the z-direction, the magnetic strip 92 slightly projects beyond the reflective surface or the reflection plane 40, respectively, of the correction illumination field facet $19_K$, namely by approximately 0.2 mm. This projecting length corresponds to a distance of the separate stops 90 from the reflective surface 40 of the correction illumination field facet $19_K$. Therefore, the separate stops 90 do not touch the reflective surface 40 of the correction illumination field facet $19_K$.

The magnetic strip 92 covers a maximum of 20% of the surface of the correction illumination field facet $19_K$ which is provided with the reflective surface 40. In the illustrated embodiment, the magnetic strip 92 covers less than 15% of this surface.

The separate stops 90 are attached to the magnetic strip 92 via a movable attachment device 93. The attachment device 93 has an electromagnet 94 including a coil 94, a ferromagnetic core 95, and an alternating current source 96. The core 95 receives the separate stop 90 which is to be transferred to the magnetic strip 92. When the separate stop 90 to be transferred has been moved to a predetermined x-position of the magnetic strip 92 via the attachment device 93, the electromagnet is switched off via a switch 97 so that the stop 90 to be transferred is moved to the magnetic strip 92 by the attachment device 93 via magnetic attraction. The attachment device 93 is drivable for displacement in the x-direction (cf. double arrow 98 in FIG. 33). The displacing movement of the attachment device 93 is controlled by a central control device which is not shown in FIG. 33.

The respective separate stop 90 can be removed from the magnetic strip 92 via the attachment device 93 in reverse order.

Figure 35:
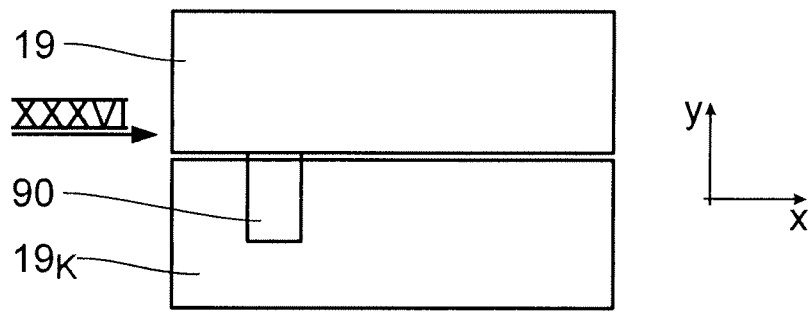
FIG. 35 is a view similar to FIG. 32 of two adjacent field facets, the lower of the two illustrated field facets being configured as a correction illumination field facet with a stop structure.
Figure 36:
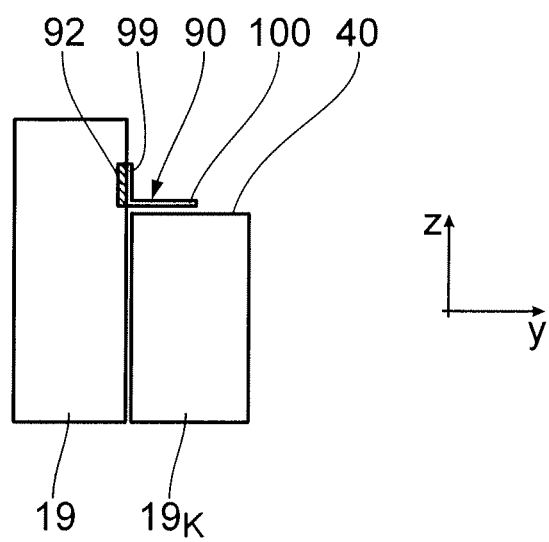
FIG. 36 is a rotated side view according to line XXXVI in FIG. 35.

The following is a description, via FIGS. 35 and 36, of another embodiment of a correction illumination field facet $19_K$. Components which correspond to those that have already been explained above with reference to FIGS. 1 to 34, and in particular with reference to FIGS. 32 to 34, have the same reference numerals and are not discussed in detail again.

In the embodiment according to FIGS. 35 and 36, the magnetic strip 92 for mounting the separate stops 90 of the shading body of the correction illumination field facet $19_K$ is laterally integrated in a field facet 19 adjacent to the correction illumination field facet $19_K$, the field facet 19 being shown above the correction illumination field facet $19_K$ in FIG. 35. In this embodiment, the magnetic strip 92 is disposed in a side wall of a base body of the adjacent field facet 19, as shown in FIG. 36.

In the embodiment according to FIGS. 35 and 36, the separate stop 90 has an angular y-z cross-section, namely in the shape of a letter L. The separate stop 90 includes a retaining leg 99 which abuts the magnetic strip 92, and a stop leg 100 for shading the reflective surface of the correction illumination field facet $19_K$. The stop leg 100 in turn has a thickness of 0.2 mm in the z-direction and is arranged at 0.2 mm above the reflective surface 40 of the correction illumination field facet $19_K$ when seen in the z-direction. The retaining leg 99 has a thickness of 0.2 mm in the y-direction as well.

The separate stops 90 may be elements which completely reflect and/or absorb the illumination light 10. Alternatively, at least some portions of the separate stops 90 may be partially transmissive of the illumination light 10. In this case, a transmittance pattern across an individual separate stop 90 is in particular conceivable in the x-direction but also in the y-direction.

Figure 37:
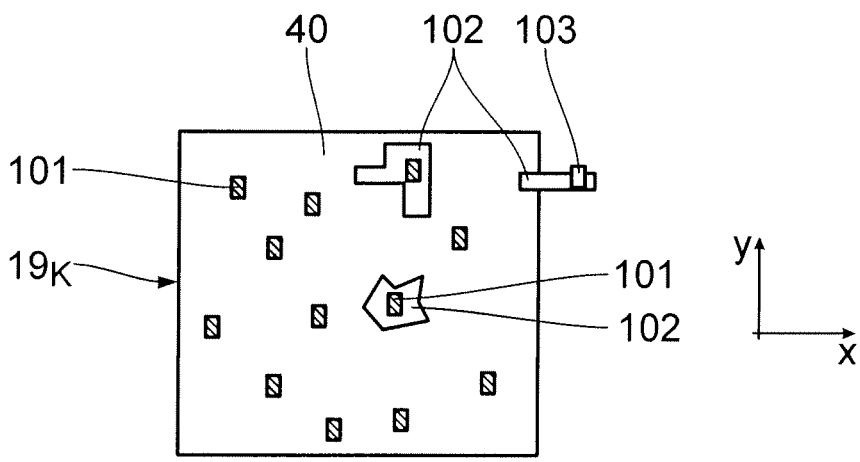
FIG. 37 is a diagrammatic plan view of another embodiment of a correction illumination field facet or correction illumination pupil facet with holding structures for individual stops arranged in a reflective surface of the facet.

The following is a description, via FIG. 37, of another embodiment of a correction illumination facet by the example of a correction illumination field facet $19_K$. A correction illumination pupil facet 27a may be of a corresponding design. Components which correspond to those that have already been explained above with reference to FIGS. 1 to 36 and in particular with reference to FIGS. 32 to 36 have the same reference numerals and are not discussed in detail again.

Magnetic surface portions 101 are arranged in the reflective surface of the correction illumination field facet $19_K$ according to FIG. 37. These surface portions 101 are magnet surfaces which are made of the same material as the magnetic strip 92 of the embodiments according to FIGS. 32 to 36. The magnetic surface portions 101 have an extension in the x- and y-directions which is much smaller than the x- and y-extensions of the correction illumination field facet $19_K$.

In the embodiment according to FIG. 37, a total of 12 surface portions 101 of this type are provided in the reflective surface of the correction illumination field facet $19_K$.

The surface extension of the magnetic surface portions 101 is so small that all of the magnetic surface portions 10 combined take up less than 20% of the total surface of the correction illumination field facet $19_K$ so that the reflective surface 40 of the correction illumination field facet $19_K$ is only reduced to a minor extent.

Depending on the intensity distribution or the illumination angle distribution to be defined on the object field 5, some or all of the magnetic surface portions 101 are provided with separate stops 102 whose function corresponds to that of the separate stops 90 of the embodiments according to FIGS. 32 to 36. The separate stops 102 may have very different boundary shapes when seen in the projection onto the xy plane, as shown in the example of FIG. 37.

Alternatively or in addition thereto, the correction illumination field facet $19_K$ may be provided with magnetic surface portions 103 corresponding to the magnetic surface portion 101, the magnetic surface portions 103 being arranged outside the reflective surface 40 of the correction illumination field facet $19_K$ which is usable by the illumination light, as shown in FIG. 37 by the example of one of the surface portions 103. This surface portion 103 may in turn carry one of the separate stops 102 which at least partially projects into the useful reflective surface of the correction illumination field facet $19_K$.

Figure 38:
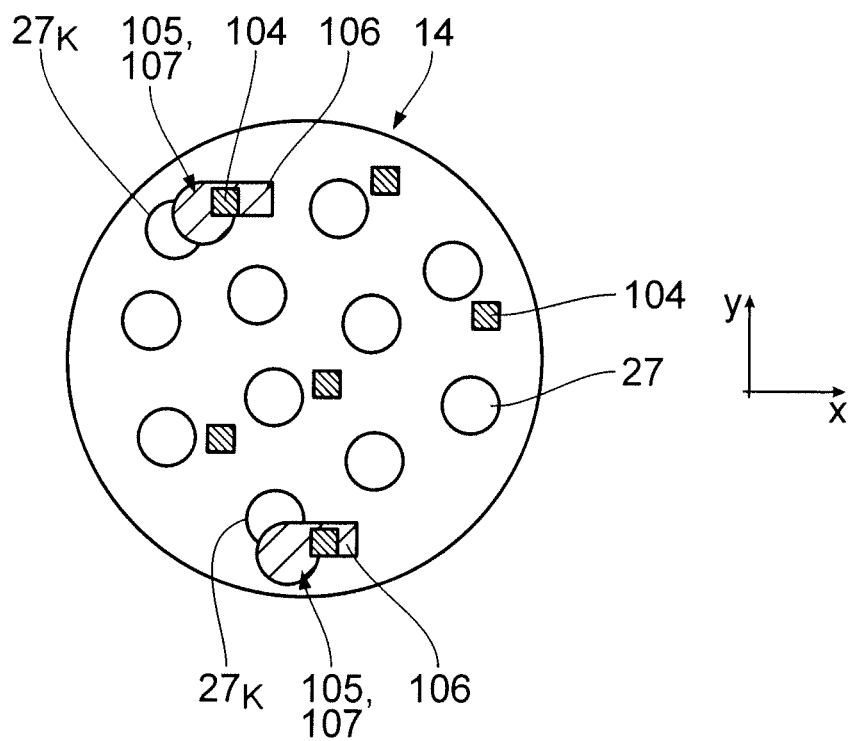
FIG. 38 is a similar view to FIG. 21 of a pupil facet mirror including an alternative embodiment of a holding mechanism for individual stops which is similar to that according to FIG. 37.

FIG. 38 shows an embodiment of the pupil facet mirror 14 with magnetic surface portions 104 in the manner of the magnetic surface portions 101 in the embodiment according to FIG. 37. In the embodiment according to FIG. 38, the magnetic surface portions 104 are arranged between the pupil facets 27 of the pupil facet mirror 14. As shown in FIG. 38 by the example of two of the magnetic surface portions 104, the magnetic surface portions 104 may be provided with separate stops 105 for defining an illumination angle distribution of the object field 5 so that the separate stops 105 at least partially shade correction illumination pupil facets $27_K$. The separate stops 105 have a retaining portion 106 via which the separate stops 105 abut the respective magnetic surface portion 104, and a shading portion 107 which at least partially covers the correction illumination pupil facet $27_K$. The shading portion 107 has a shape which is adapted to the round shapes of the pupil facets 27, the shape being of such a size that the shading portion 107 is able to completely cover a correction illumination pupil facet $27_K$.

In the embodiments according to FIGS. 32 to 38, a quick adaptation of the shading effect of shading body which shades the correction illumination field facet $19_K$ or the correction illumination pupil facet $27_K$ to adapt the intensity distribution or the distribution of illumination angles across the object field 5 is possible. To this end, the system performance, in other words the intensity distribution and the illumination angle distribution across the object field 5, is at first measured for instance via a calibration measurement. This measurement may take place in the region of the image plane 9 or in the wafer plane, respectively. After the measurement, a shading is calculated that is involved on the respective optical correction element, i.e. for instance on the correction illumination field facets $19_K$ or on the correction illumination pupil facets $27_K$. Afterwards, the shading body, which is composed of individual separate stops 90, 102, 105 or of a plurality of such separate stops for forming a stop structure 89 in the embodiments according to FIGS. 32 to 38, is attached to the respective correction illumination field facet $19_K$ and/or the respective correction illumination pupil facet $27_K$ via the attachment device 93.

The following is a description, via FIGS. 39 to 46, of further embodiments of field facet mirrors with field facet blocks including basic illumination field facets and correction illumination field facets. Components which correspond to those that have already been explained above with reference to FIGS. 1 to 38 have the same reference numerals and are not discussed in detail again.

Figure 39:
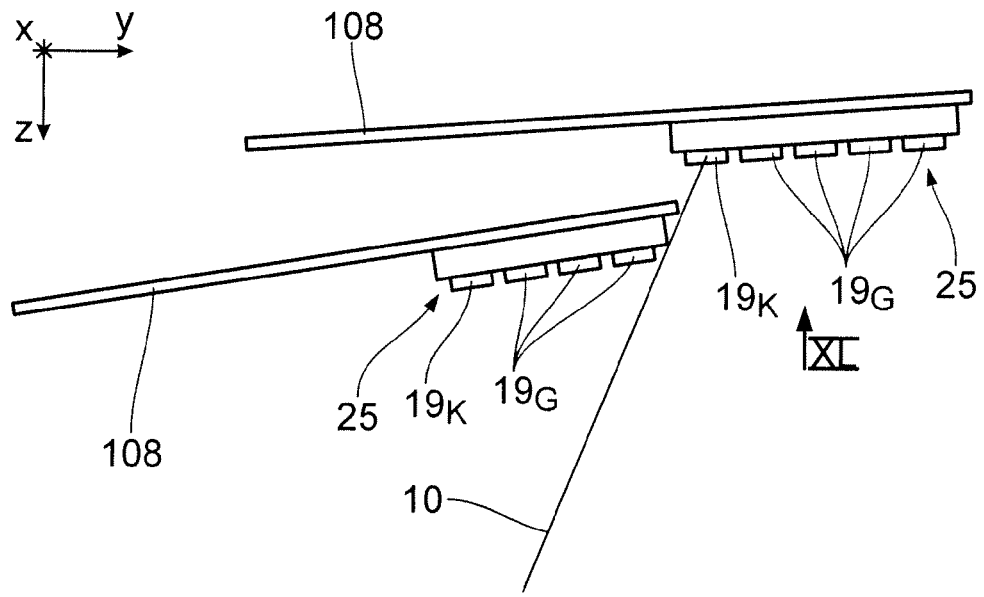
FIG. 39 is a side view of two field facet blocks of another embodiment of a field facet mirror with associated carrier elements.
Figure 41:
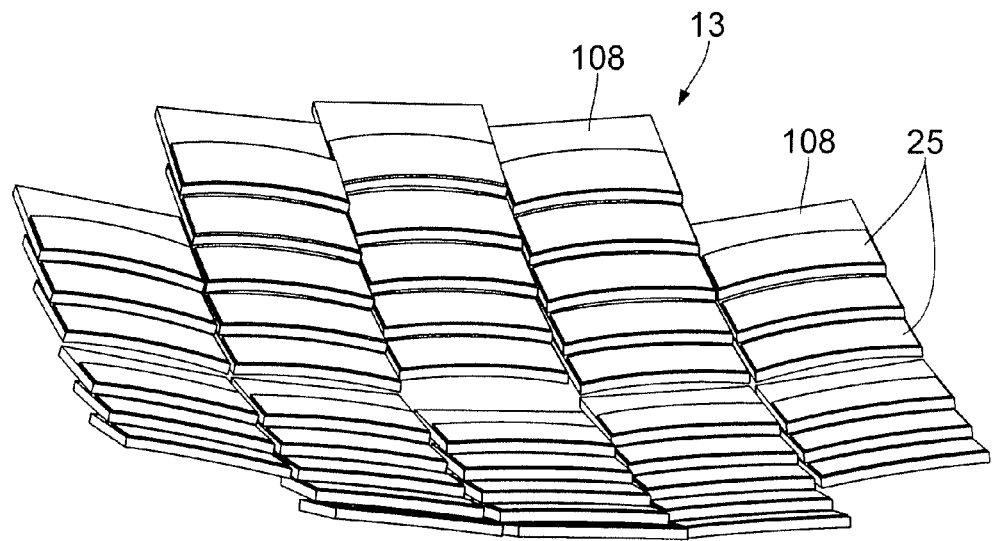
FIG. 41 is a perspective view of an entire arrangement of carrier elements and field facet blocks according to FIGS. 39 and 40 for forming this further embodiment of the field facet mirror, seen obliquely from above on a total reflective surface of the field facet mirror.

FIG. 39 shows two field facet blocks 25 of a field facet mirror 13 whose arrangement including more than 40 of such field facet blocks 25 is shown in FIG. 41. The field facet mirror 13 according to FIG. 41 has a total reflective surface shape which resembles a concave bowl. Each of the field facet blocks 25 is carried by a carrier element 108 which is in turn rigidly connected to a field facet carrier (not shown) of the field facet mirror 13 according to FIG. 41 in a manner not shown.

Figure 40:
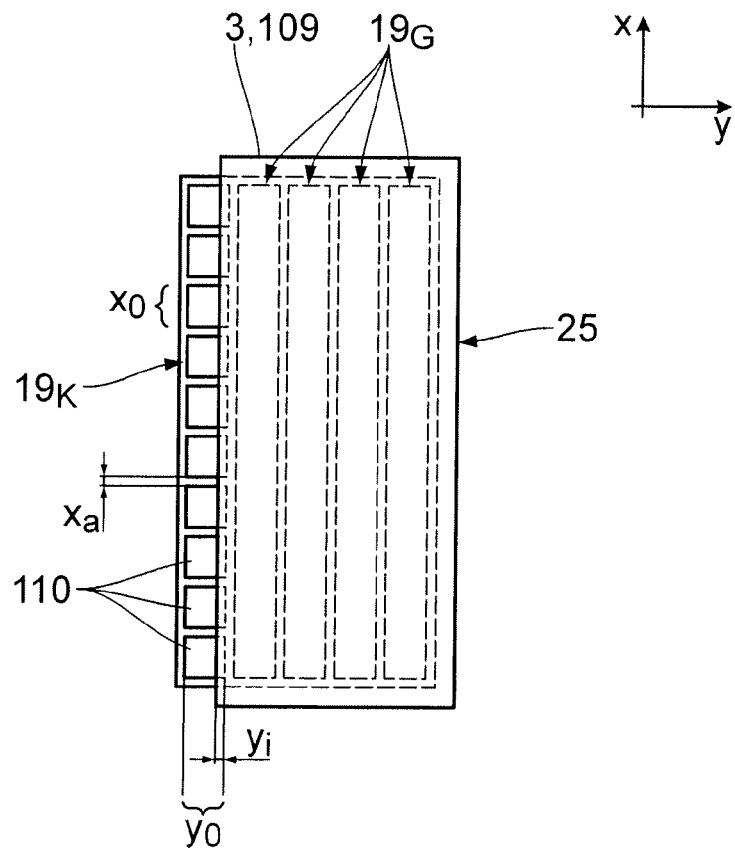
FIG. 40 is a plan view of the field facets of the field facet block on the right of FIG. 39, the field facet block including a correction illumination field facet which is in turn divided into partially illuminated partial correction illumination facets.

In the embodiment according to FIGS. 39 to 41, each of the field facet blocks 25 includes a plurality of basic illumination field facets $19_G$ and in each case one correction illumination field facet $19_K$. The correction illumination field facet $19_K$ of the field facet block 25 shown on the right of FIG. 39 is the field facet 19 of this field facet block 25 which is arranged farthest to the left. This correction illumination field facet $19_K$ is not completely exposed to illumination light 10, in other words the EUV radiation, but the largest part thereof is shaded by the adjacent field facet block 25 shown on the left of FIG. 39. This is diagrammatically indicated in FIG. 39 by a ray of the illumination light bundle 10 which barely just passes by the field facet block 25 shown on the left of FIG. 39.

The shading effect of the field facet block 25 shown on the left of FIG. 39 is illustrated in FIG. 40. The portion of the illumination light 3, which passes by the field facet blocks 25 that are adjacent to the field facet block 25 shown in FIG. 40, is illustrated in FIG. 40 by an illumination area 109. In the y-extension, corresponding to the scanning direction, of the correction illumination field facet $19_K$, in other words the shorter field facet dimension, only a small portion $y_i$ of the entire y-extension $y_0$ of the correction illumination field facet $19_K$ is illuminated by the illumination light 3. The ratio $y_1/y_0$ may for instance be 1:2, 1:3, 1:4, 1:5 or 1:6.

The correction illumination field facet $19_K$ according to FIG. 40 is divided into a plurality of partial correction illumination facets 110 which are orientable independently of one another. The partial correction illumination facets 110 have reflective surfaces in the shape of a square with extensions $x_0=y_0$. The partial correction illumination facets 110 are micromirrors which are switchable or actuable independently of one another.

Due to the fact that they are not entirely arranged in the illumination area 109, the partial correction illumination facets 110 are arranged on a partially shaded area of the carrier element 108 and therefore of the carrier of the field facet mirror 13.

Neighbors of the partial corrective illumination facets 110 of the correction illumination field facet $19_k$ according to FIG. 40 have a distance $x_a$ from each other along the longer field dimension x. The ratio $x_a/x_0$ is again 1:2, 1:3, 1:4, 1:5 or 1:6. Depending on the switching position of the individual partial correction illumination facets 110 and due to this distance $x_a$, the entire correction illumination field facet $19_K$ has a pattern in the form of a step function along the longer field dimension x, i.e. also along the longer field facet dimension x, the pattern deviating from a constant reflectivity in a defined manner. Along the longer field facet dimension x, the reflectivity has a value $R_0$ across the extensions $x_0$ of the partial corrective facets 110 while along the gaps $x_a$, the reflectivity has a value of R=0.

The partial correction illumination facets 110 according to FIG. 40 can be oriented and allocated to particular illumination channels independently from one another before being imaged onto predetermined portions of the object field 5 via the tilting of the associated correction illumination pupil facets so as to achieve a flexible correction of illumination inhomogeneities in the object field 5 or a defined overcompensation of intensity effects or illumination angle effects in the projection optics 7. When the partial correction illumination facets 110 are actuated, the associated partial illumination channel may also be switched off, in other words, the partial correction illumination facet 110 is moved to a position where the illumination light impinging upon this partial facet 110 is no longer able to reach the object field 5.

The partial correction illumination facets 110 may have a corrective effect which influences the illumination intensity across the object field 5 and/or the illumination angle distribution across the object field 5.

The arrangement of the partial correction illumination facets 110 according to FIG. 40 within the entire correction illumination field facet $19_K$ provides an arrangement of this correction illumination field facet $19_K$ on the basis of a set of step functions. Via the various field facet blocks 25, there can now be provided a set of correction illumination field facets $19_K$ with intensity variations across the field height x, the intensity variations correspond to this set of step functions. Alternatively or in addition thereto, a similar provision may occur, via the set of partial correction illumination functions 110, in a single correction illumination field facet $19_K$ on the basis of a set of step functions. The correction illumination field facets $19_K$ may thus be divided into similar or different partial correction illumination facets 110 between the various field facet blocks 25 of the field facet mirror 13 according to FIG. 41; in the latter case, different correction illumination field facets $19_K$ are divided into partial correction illumination facets 110 along the longer field dimension x in different ways.

Figure 42:
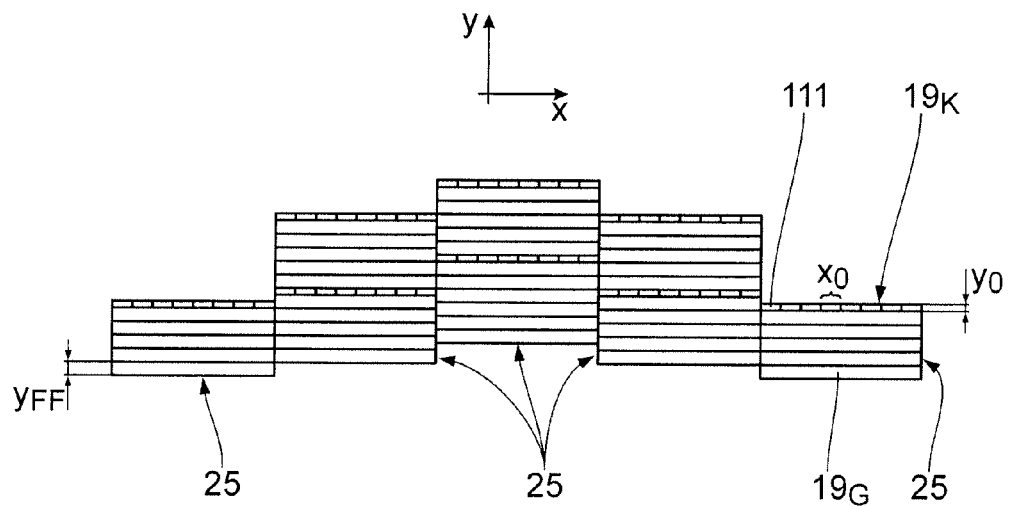
FIG. 42 is an arrangement of a total of eight field facet blocks of another embodiment of a field facet mirror, with each of the field facet blocks including a correction illumination field facet at the upper edge in the form of a row of partial correction illumination facets lined up along a longer field dimension, and with all facet blocks being arranged next to one another on a field facet carrier in a way as to not shade each other.

FIG. 42 shows an arrangement of a total of eight field facet blocks 25 which are part of another embodiment of a field facet mirror 13.

In the arrangement according to FIG. 42, the field facet blocks 25 are arranged next to one another on a plane field facet carrier which is not shown in FIG. 42 and whose carrier plane is parallel to the xy plane. Each of the field facet blocks 25 according to FIG. 42 includes a total of five basic illumination field facets $19_G$ and one correction illumination field facet $19_K$ which is in turn divided, along the longer field dimension x, into a plurality of partial correction illumination facets 111 which are orientable independently from one another and are in turn configured as micromirrors which are actuable independently from one another. Each of the correction illumination field facets $19_K$ includes a total of nine partial correction illumination facets 111 which have in each case the same x-extension $x_0$. A y-extension $y_0$ of the partial correction illumination facets 111 is considerably smaller than the y-extension $y_{FF}$ of the basic illumination field facets $19_G$. The ratio $y_0/y_{FF}$ is again 1:2, 1:3, 1:4, 1:5 or 1:6.

Between adjacent partial correction illumination facets 111, there is again a gap $x_a$ which is very much smaller than the extension $x_0$. The ratio $x_a/x_0$ may for instance be 1:10 or 1:20.

In contrast to the partial correction illumination facets 110, the partial correction illumination facets 111 are completely illuminated. Due to their y-extension which is smaller compared to the basic illumination field facets, the partial correction illumination facets 111 have a corrective effect which corresponds to the partial correction illumination facets 110.

Figure 43:
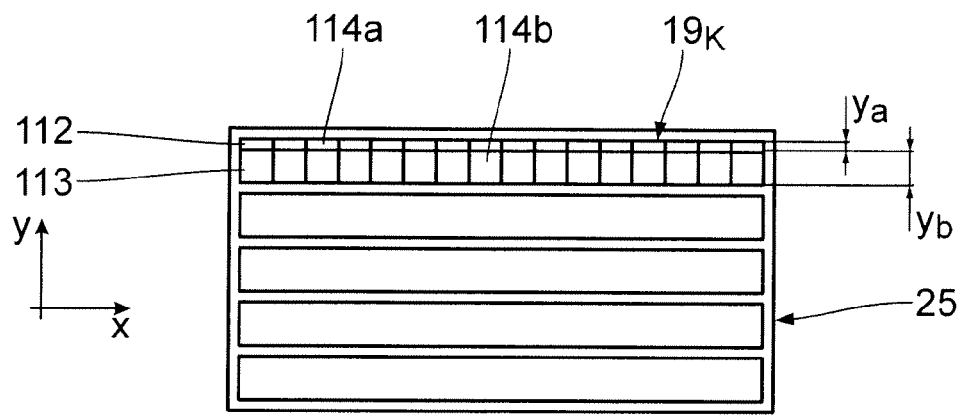
FIG. 43 is a similar view to FIG. 40 of another embodiment of a field facet block including a correction illumination field facet which is divided into two rows of partial correction illumination facets.

Compared to FIG. 42, FIG. 43 is an enlarged view of another embodiment of a field facet block 25. A correction illumination field facet $19_K$ of the field facet block 25 according to FIG. 43 is divided into two rows 112, 113 of partial correction illumination facets 114a and 114b. The rows 112, 113 extend along the longer field dimension or field facet dimension x. The partial correction illumination facets 114a, 114b in the various rows 112, 113 have different extensions $y_a$ and $y_b$, the ratio of the extensions $y_a/y_b$ being such that 1:2, 1:3, 1:4, 1:5 or 1:6. The partial correction illumination facets 114a and 114b are again configured as micromirrors which are actuable and therefore orientable independently from one another.

As already explained above with respect to the partial correction illumination facets 110, 111, the partial correction illumination facets 114a, 114b can also be used to flexibly allocate illumination channels or to switch on or off the associated partial illumination channels so as to correct or compensate for the intensity distribution or the illumination angle distribution across the object field 5. The different y-extensions $y_a$, $y_b$ of the partial correction illumination facets 114a, 114b allow the relative influence of such a correction to be defined beforehand. If for instance a higher intensity reduction is desired at the edge of the object field allocated to the right-hand edge of the field facets according to FIG. 43 than at the left-hand edge, then the rightmost partial correction illumination facet 114b in FIG. 43 and the leftmost partial correction illumination facet 114a in FIG. 43 are switched off. In this example, an even higher shading effect is achievable at the edge of the object field 5 allocated to the right-hand edge of the field facets by switching off both the partial correction illumination facet 114a and the partial correction illumination facet 114b.

Figure 44:
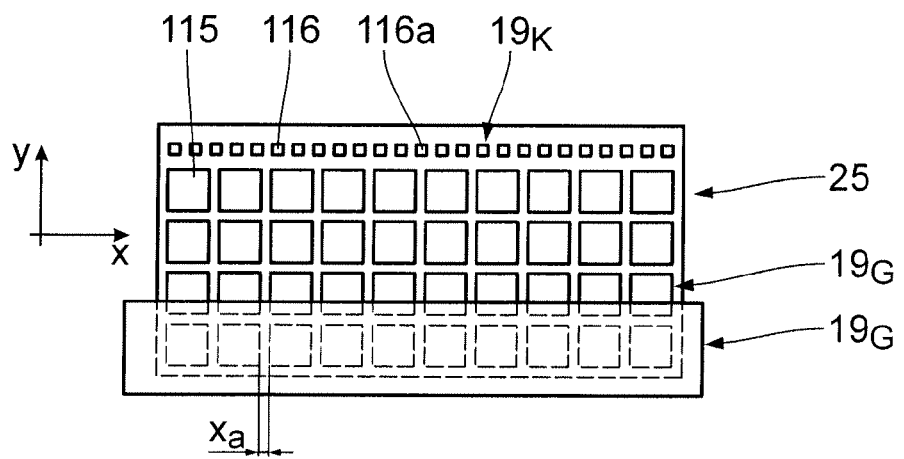
FIG. 44 is a view similar to FIG. 40 of another embodiment of a field facet block including a total of four basic illumination field facets which are in turn divided into a plurality of partial basic illumination facets along the longer field dimension, and a correction illumination field facet shown at the top of FIG. 44 which is in turn composed of a row of partial correction illumination facets lined up along the longer field dimension.

FIG. 44 shows another embodiment of a field facet block 25 including a total of three basic illumination field facets $19_G$ and one correction illumination field facet $19_K$. In the embodiment according to FIG. 44, the basic illumination field facets $19_G$ are divided into a plurality of partial basic illumination facets 115 along the longer field dimension x as well. The design of the basic illumination field facets $19_G$ corresponds to the design of the correction illumination field facets $19_K$ according to FIG. 40. The partial basic illumination facets 115 are again micromirrors which are actuable and therefore orientable independently from one another. Thus, the basic illumination field facets $19_G$ can be used for a rough correction of the illumination of the object field 5 as well. Fine correction is then performed via the correction illumination field facet $19_K$ which, in the embodiment according to FIG. 44, is composed of a plurality of partial correction illumination facets 116 which are orientable independently from one another and are lined up along the longer field dimension x. The reflective surfaces of the partial correction illumination facets 116 are much smaller than those of the partial basic illumination facets 115. A ratio of these reflective surfaces is for instance 1:10 or 1:20. Even smaller ratios are conceivable as well. The x-distance of adjacent partial corrective field facets 116 approximately corresponds to the x-extension of these partial correction illumination facets 116. Other x-distances, in particular smaller x-distances, between adjacent partial correction illumination facets 116 are conceivable as well. The partial correction illumination facets 116 may be arranged along the longer field dimension x in such a way as to be disposed on x-positions where gaps $x_a$ are located between the partial basic illumination facets 115. The partial correction illumination facet 116a in FIG. 44 is an example of such an arrangement.

Figure 45:
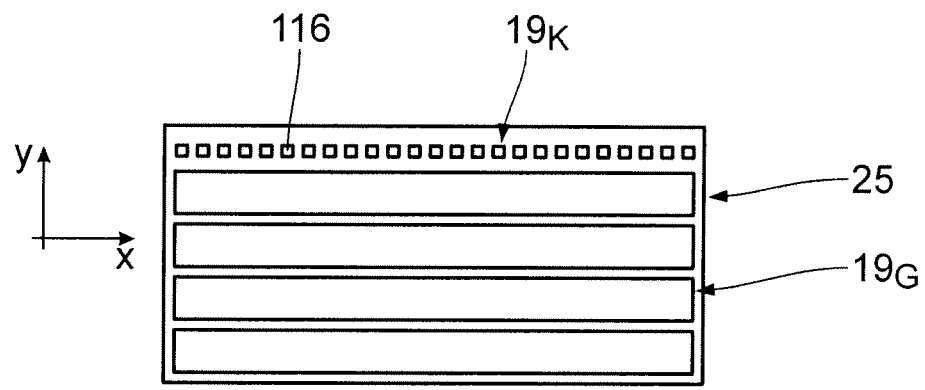
FIG. 45 is a similar view to FIG. 44 of another embodiment of a field facet block with a correction illumination field facet according to FIG. 44 and basic illumination field facets according to FIG. 40 or 43.

FIG. 45 shows another embodiment of a field facet block 25 including basic illumination field facets $19_G$ which correspond to those of the embodiment according to FIG. 43, and one correction illumination field facet $19_K$ which includes partial correction illumination facets 116 and corresponds to those according to FIG. 44.

Figure 46:
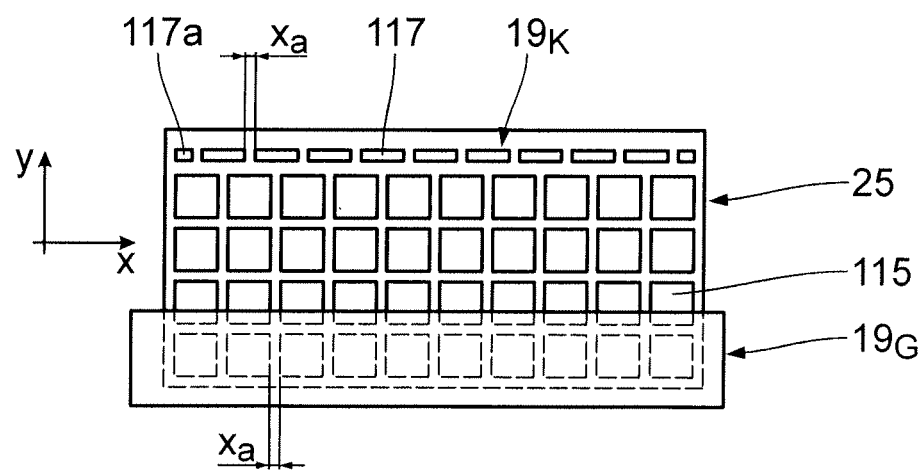
FIG. 46 is a similar view to FIG. 44 of a field facet block including basic illumination field facets according to FIG. 44 and a correction illumination field facet shown at the top which is in turn composed of a row of partial correction illumination facets lined up along the longer field dimension, the partial correction illumination facets covering gaps between the partial basic illumination facets when seen from above.

FIG. 46 shows another embodiment of a field facet block 25 including basic illumination field facets $19_G$ which correspond to those according to FIG. 44, in other words they are divided into partial basic illumination facets 115. A correction illumination field facet $19_K$ is divided into partial correction illumination facets 117 which have a different extension along the longer field dimension x than the partial corrective field facets 116 of the embodiment according to FIG. 44. In the embodiment according to FIG. 46, the partial correction illumination facets 117 are arranged in such a way that they cover in each case the gaps $x_a$ between the adjacent partial basic illumination facets 115 when seen in the scanning direction y. In the embodiment according to FIG. 46, the partial correction illumination facets 117 are therefore staggered relative to the partial basic illumination facets 115 along the longer field dimension x, wherein the partial correction illumination facets 117 are arranged at positions of the gaps $x_a$ between adjacent partial basic illumination facets 115. Apart from two partial correction illumination facets 117a at the edges, the remaining partial correction illumination facets 117 of the correction illumination field facet $119_K$ according to FIG. 46 have an x-extension which corresponds to the x-extension of the partial basic illumination facets 115, with the result that the distance of adjacent partial correction illumination facets 117 in the x-direction is similar to the distance $x_a$ as well.

The partial corrective facets 117 may therefore be used to compensate for gap effects caused by the illumination of the object field 5 using the partial basic illumination facets 115.

The field facet blocks 25 according to FIGS. 43 to 46 may be used in an arrangement of the field facet blocks 25 according to FIG. 42 or alternatively also in an arrangement of the field facet blocks 25 according to FIG. 41.

In an embodiment of a correction illumination field facet $19_K$ which is not shown, there are more than two rows of partial correction illumination facets. Instead of the two rows 112, 113 in the embodiment according to FIG. 43, there may also be three or even more rows of partial correction illumination facets which may have a y-extension ratio of 1:2:4 or of 1:2:4:8, for example. Other extension ratios, which correspond to a corresponding set of corrective step functions, are conceivable as well.

The basic illumination field facets $19_G$ and the correction illumination field facets $19_K$ as well as the facet arrangements composed of the above described partial facets need not necessarily be rectangular in shape but can also have an arcuate shape. Arcuate field facets are principally known to those skilled in the art. The arcuate field facets can then be imaged into an object field which has a corresponding arcuate shape.

In the above described embodiments, the object field illumination is corrected via rectangular correction illumination field facets $19_K$ or 71, respectively. The disclosure is not restricted to rectangular correction illumination field facets $19_K$ or 71 of this type. Curved correction illumination field facets can be used in the above described embodiments as well, in particular to achieve a correction of the illumination of an arcuate object field. If curved correction illumination field facets are used, then the basic illumination field facets may be curved as well. The shape of the curved field facets may correspond to that of the arcuate object field.

An illumination correction via the illumination optics 4 is performed as follows: In a first step, a corresponding detector is used to determine an illumination intensity distribution in the object field 5. An illumination angle distribution in the object field can additionally be measured as well. The design of the correction illumination field facets $19_K$ or 71 is then calculated on the basis of this measurement result; the correction illumination pupil facets $27_K$ or 76 are allocated to these correction illumination field facets $19_K$ or 71 on the basis of this measurement as well. Afterwards, the calculated design and allocation is provided in the illumination optics 4, which may for instance take place by a defined selection of used correction illumination field facets $19_K$ via the stops 29 to 33. This is then followed by the projection exposure in which are provided the reticle 20 and the wafer to which an illumination-light sensitive coating is applied; during the projection exposure, at least a portion of the reticle 20 is projected onto the wafer via the projection exposure apparatus 1. After exposure of the light-sensitive layer on the wafer to the illumination light bundle 10, the layer is developed to obtain the micro- or nanostructure component, for instance a semiconductor chip.

The various variants of the above explained correction illumination field facets may serve to dynamically control their bundle guiding effect. To this end, the correction illumination field facets can be actuated by a control device of the projection exposure apparatus.

This actuation can take place on the basis of measurements of the intensity distribution along the long field dimension in the object field or alternatively in the image field.

When the field facet mirror 13 including the correction illumination field facets is operated, individual correction illumination field facets or groups of correction illumination field facets can be switched on or off, in particular if they are actively displaceable or shadeable.

In some of the above described embodiments of the correction illumination field facets, it is possible to illuminate only partial areas of the object field. This may be used to compensate for intensity dips at particular field heights, i.e. in partial areas of the field, by providing additional illumination light at these field points via correction illumination field facets.

The boundary shapes of effectively illuminated areas of the various embodiments of correction illumination field facets described above may have at least one inflection point. This boundary can be the separation line between a highly reflecting area of the correction illumination field facet and a less reflective or non reflective area thereof. The boundary with the at least one inflection point may also be a facet boundary which is physically present. The boundary can also be generated by a correspondingly formed shading body.

What is claimed is:

1. An illumination optics configured to guide an illumination light bundle from a radiation source to an object field, the object field having an aspect ratio of a longer field dimension to a shorter field dimension, the aspect ratio being greater than 1, the illumination optics comprising:
   a field facet mirror comprising a plurality of field facets configured to set illumination conditions in the object field; and
   a following optics downstream of the field facet mirror, the following optics being configured to transmit the illumination light into the object field;
   wherein:
      the following optics comprises a pupil facet mirror comprising a plurality of pupil facets;
      the plurality of pupil facets including a first pupil facet and a second pupil facet which is point symmetric to the first pupil facet relative to a center of a pupil defined by the pupil facet mirror;
      each field facet has a corresponding pupil facet so that a portion of the illumination light bundle impinging upon a given field facet is guided to the object field via its corresponding pupil facet;
      the field facet mirror comprises a plurality of basic illumination field facets configured to provide a basic illumination of the object field via corresponding basic illumination pupil facets;
      the field facet mirror comprises a plurality of correction illumination field facets configured to allow illumination of the object field to be corrected via corresponding correction illumination pupil facets;
      for a first group of the correction illumination field facets, each correction illumination field facet has a longer field facet dimension and a shorter field facet dimension;
      for the first group of the correction illumination field facets, each correction illumination field facet has a reflectivity for the illumination light which follows a reflectivity pattern along the longer field facet dimension that deviates from a constant reflectivity;
      the first group of correction illumination field facets comprises first and second correction illumination field facets having the same reflectivity pattern;
      the first correction illumination field facet is assigned to the first pupil facet;
      the second correction illumination field facet is assigned to the second pupil facet; and
      the illumination optics are configured to be used in EUV microlithography.

2. The illumination optics according to claim 1, wherein for the first group of the correction illumination field facets, each correction illumination field facet comprises absorbing point structures with a constant area density.

3. The illumination optics according to claim 2, wherein, for each correction field facet in the first group of the correction illumination field facets, a maximum width of a portion of the correction illumination field facet comprising the absorbing point structures is smaller than a width of the correction illumination field facet perpendicular to the longer field facet dimension.

4. The illumination optics according to claim 1, wherein for the first group of the correction illumination field facets, each correction illumination field facet comprises a reflective coating having a width which varies in a direction perpendicular to the longer field facet dimension.

5. The illumination optics according to claim 1, wherein for the first group of the correction illumination field facets, each correction illumination field facet comprises absorbing point structures having a varying area density.

6. The illumination optics according to claim 1, wherein the field facet mirror is switchable between at least two modes of operation which are different in terms of a number of the correction illumination field facets that contribute to the illumination of the object field and/or an arrangement of the correction illumination field facets that contribute to the illumination of the object field.

7. The illumination optics according to claim 1, wherein the correction illumination field facets are arranged outside a contour of the field facet mirror defined by all of the basic illumination field facets.

8. The illumination optics according to claim 1, wherein the correction illumination pupil facets are arranged within a contour of the pupil facet mirror defined by all of the basic illumination pupil facets.

9. An optical system, comprising:
   an illumination optics according to claim 1; and
   a projection optics configured to project the object field of the illumination optics onto an image field,
   wherein the optical system is configured to be used in microlithography.

10. The optical system according to claim 9, wherein each correction illumination field facet has a reflective surface, and the illumination optics is configured so that, during use of the illumination optics, an entire reflective surface of each correction illumination field facet is illuminated with the illumination light.

11. An apparatus, comprising:
   an EUV radiation source configured to generate an illumination light bundle;
   an illumination optics according to claim 1; and
   a projection optics configured to project the object field of the illumination optics onto an image field,
   wherein the apparatus is a microlithography projection exposure apparatus.

12. The illumination optics according to claim 1, wherein for each correction illumination field facet of the field facet mirror, the correction illumination field facet has a non-constant reflectivity for the illumination light along the longer field facet dimension.

13. The illumination optics of claim 1, wherein each correction illumination field facet has a reflective surface, and the illumination optics is configured so that, during use of the illumination optics, an entire reflective surface of each correction illumination field facet is illuminated with the illumination light.

14. An illumination optics configured to guide an illumination light bundle from a radiation source to an object field, the object field having an aspect ratio of a longer field dimension to a shorter field dimension that is greater than 1, the illumination optics comprising:
- a field facet mirror comprising a plurality of field facets including a plurality of basic illumination field facets and a plurality of correction illumination field facets;
- a pupil facet mirror downstream of the field facet mirror, the pupil facet mirror comprising a plurality of pupil facets including a plurality of basic pupil facets and a plurality of correction pupil facets;

wherein:
- the plurality of pupil facets including a first pupil facet and a second pupil facet which is point symmetric to the first pupil facet relative to a center of a pupil defined by the pupil facet mirror;
- each field facet has a corresponding pupil facet so that a portion of an illumination light bundle impinging upon a given field facet is guided to the object field via its corresponding pupil facet;
- during use of the illumination optics, a basic illumination of the object field is achieved via the plurality of basic illumination field facets and their corresponding basic illumination pupil facets;
- during use of the illumination optics, illumination of the object field is corrected via the plurality of correction illumination field facets and their corresponding correction illumination pupil facets;
- for a first group of the correction illumination field facets, each correction illumination field facet has a non-constant reflectivity pattern for the illumination light along the longer field facet dimension;
- the first group of correction illumination field facets comprises first and second correction illumination field facets having the same reflectivity pattern;
- the first correction illumination field facet is assigned to the first pupil facet;
- the second correction illumination field facet is assigned to the second pupil facet; and
- the illumination optics are configured to be used in EUV microlithography.

15. The illumination optics according to claim 14, wherein for the first group of the correction illumination field facets, each correction illumination field facet comprises absorbing point structures with a constant area density.

16. The illumination optics according to claim 14, wherein for the first group of the correction illumination field facets, each correction illumination field facet comprises absorbing point structures have a varying area density.

17. The illumination optics according to claim 14, wherein:
- the field facet mirror is switchable between a first mode of operation and a second mode of operation; and
- the first mode of operation is different from the second mode of operation in terms of a number of the correction illumination field facets that contribute to the illumination of the object field and/or an arrangement of the correction illumination field facets that contribute to the illumination of the object field.

18. An optical system, comprising:
- an illumination optics according to claim 14; and
- a projection optics configured to project the object field of the illumination optics onto an image field,
- wherein the optical system is configured to be used in microlithography.

19. An apparatus, comprising:
- an EUV radiation source configured to generate an illumination light bundle;
- an illumination optics according to claim 14; and
- a projection optics configured to project the object field of the illumination optics onto an image field,
  - wherein the apparatus is a microlithography projection exposure apparatus.

20. The optical system according to claim 19, wherein each correction illumination field facet has a reflective surface, and the illumination optics is configured so that, during use of the illumination optics, an entire reflective surface of each correction illumination field facet is illuminated with the illumination light.

21. The illumination optics according to claim 14, wherein for each correction illumination field facet of the field facet mirror, the correction illumination field facet has a non-constant reflectivity for the illumination light along the longer field facet dimension.

22. The illumination optics of claim 14, wherein each correction illumination field facet has a reflective surface, and the illumination optics is configured so that, during use of the illumination optics, an entire reflective surface of each correction illumination field facet is illuminated with the illumination light.

* * * * *

UNITED STATES PATENT AND TRADEMARK OFFICE
CERTIFICATE OF CORRECTION

Page 1 of 1

PATENT NO. : 8,587,767 B2
APPLICATION NO. : 12/915785
DATED : November 19, 2013
INVENTOR(S) : Damian Fiolka et al.

It is certified that error appears in the above-identified patent and that said Letters Patent is hereby corrected as shown below:

In the Specification:

Col. 19, line 18, after "packing" insert -- . --.

Col. 21, line 30, delete "19" and insert -- $19_{K3}$ --.

Col. 23, line 17, delete "$E_{0°/90}{}^{O}$" and insert -- $E_{0°/90°}$ --.

Col. 23, line 35, delete "$E_{-45°/45°})$:" and insert -- $E_{-45°/45°})$: --.

Col. 23, line 43, delete "$E_{0°/90}{}^{O}$" and insert -- $E_{0°/90°}$ --.

Col. 39, line 62, delete "$119_K$" and insert -- $19_K$ --.

In the Claims:

Col. 44, line 28, delete "optical system" and insert -- apparatus --.

Signed and Sealed this
Twenty-fifth Day of March, 2014

Michelle K. Lee
*Deputy Director of the United States Patent and Trademark Office*